United States Patent
Donowho et al.

(10) Patent No.: US 10,237,994 B2
(45) Date of Patent: Mar. 19, 2019

(54) VERTICAL MOUNTING RAIL WITH CABLE MANAGEMENT FEATURES

(71) Applicant: CHATSWORTH PRODUCTS, INC., Agoura Hills, CA (US)

(72) Inventors: D. Brian Donowho, Austin, TX (US); William Drew Krietzman, Castle Rock, CO (US); Brandi May Oldt, Austin, TX (US); Jose Arturo Garza, Jr., Pflugerville, TX (US); Richard Evans Lewis, II, Austin, TX (US)

(73) Assignee: Chatsworth Products, Inc., Agoura Hills, CA (US)

(*) Notice: Subject to any disclaimer, the term of this patent is extended or adjusted under 35 U.S.C. 154(b) by 0 days.

(21) Appl. No.: 15/581,982

(22) Filed: Apr. 28, 2017

(65) Prior Publication Data

US 2017/0290181 A1    Oct. 5, 2017

Related U.S. Application Data

(60) Continuation of application No. 15/062,372, filed on Mar. 7, 2016, now Pat. No. 9,642,270, which is a
(Continued)

(51) Int. Cl.
*H05K 5/02*    (2006.01)
*H05K 7/18*    (2006.01)
(Continued)

(52) U.S. Cl.
CPC .......... *H05K 5/0217* (2013.01); *A47B 47/00* (2013.01); *H05K 5/0234* (2013.01);
(Continued)

(58) Field of Classification Search
CPC .... H05K 5/0247; H05K 5/0217; H05K 7/183; H05K 7/186; H05K 7/1489
See application file for complete search history.

(56) References Cited

U.S. PATENT DOCUMENTS

| 824,544 A | 6/1906 | Hossege |
| 1,129,040 A | 2/1915 | McClure |

(Continued)

FOREIGN PATENT DOCUMENTS

| AU | 2008254682 | 11/2012 |
| CN | 102177633 A | 9/2011 |

(Continued)

OTHER PUBLICATIONS

Information Disclosure Statement (IDS) Letter Regarding Common Patent Application(s), dated Nov. 13, 2017.
(Continued)

*Primary Examiner* — Hanh V Tran
(74) *Attorney, Agent, or Firm* — Tillman Wright, PLLC; James D. Wright; David R. Higgins

(57) ABSTRACT

An electronic equipment enclosure includes a frame structure that includes side cross members between front and rear frames, a vertical mounting rail fastened to the frame structure, and a first cable management structure. The vertical mounting rail includes a fastening portion, for interfacing with the frame structure, and at least one support portion including an aperture therein. The first cable management structure has a boss adapted to be maneuvered into the aperture and seated therein so as to fasten the first cable management structure to the at least one support portion without a separate fastener.

20 Claims, 16 Drawing Sheets

Related U.S. Application Data continuation of application No. 14/541,507, filed on Nov. 14, 2014, now Pat. No. 9,408,326, which is a continuation of application No. 13/229,704, filed on Sep. 10, 2011, now Pat. No. 8,901,438, application No. 15/581,982, which is a continuation of application No. 14/711,211, filed on May 13, 2015, now Pat. No. 9,781,852, which is a continuation of application No. 14/157,349, filed on Jan. 16, 2014, now Pat. No. 9,055,677, which is a division of application No. 13/229,705, filed on Sep. 10, 2011, now abandoned.

(60) Provisional application No. 61/381,904, filed on Sep. 10, 2010, provisional application No. 61/381,905, filed on Sep. 10, 2010.

(51) Int. Cl.
  *H05K 7/20* (2006.01)
  *A47B 47/00* (2006.01)

(52) U.S. Cl.
  CPC ............ *H05K 5/0247* (2013.01); *H05K 7/18* (2013.01); *H05K 7/183* (2013.01); *H05K 7/20009* (2013.01)

(56) References Cited

U.S. PATENT DOCUMENTS

| | | |
|---|---|---|
| 1,919,166 A | 7/1933 | Lavarack |
| 2,039,886 A | 5/1936 | Cohn |
| 2,424,217 A | 7/1947 | Bales |
| 2,459,953 A | 1/1949 | Mills |
| 2,616,142 A | 11/1952 | Tinnerman |
| 2,667,368 A | 1/1954 | Ferguson |
| 2,756,369 A | 7/1956 | Gorrie |
| 2,880,379 A | 3/1959 | Stoddart et al. |
| 2,999,190 A | 9/1961 | Armandroff et al. |
| 3,034,844 A | 5/1962 | Anderson et al. |
| 3,143,195 A | 8/1964 | Schroeder |
| 3,192,306 A | 6/1965 | Skonnord |
| 3,265,419 A | 8/1966 | Durnbaugh et al. |
| 3,404,931 A | 10/1968 | Fall et al. |
| 3,563,627 A | 2/1971 | Whipps |
| 3,585,333 A | 6/1971 | Valle et al. |
| 3,655,254 A | 4/1972 | Mayer et al. |
| 3,675,955 A | 7/1972 | Hajduk |
| 3,895,215 A | 7/1975 | Gordon |
| 4,040,694 A | 8/1977 | Lascarrou |
| 4,101,233 A | 7/1978 | McConnell |
| 4,148,453 A | 4/1979 | Brantly |
| 4,495,234 A | 1/1985 | Tominaga et al. |
| 4,497,411 A * | 2/1985 | DeBortoli .............. H05K 7/186 211/189 |
| 4,524,937 A | 6/1985 | Zizan |
| 4,551,577 A | 11/1985 | Byrne |
| 4,553,674 A | 11/1985 | Yoshikawa et al. |
| 4,592,602 A | 6/1986 | Kuster et al. |
| 4,643,319 A | 2/1987 | Debus et al. |
| 4,715,502 A | 12/1987 | Salmon |
| 4,796,541 A | 1/1989 | Halstrick |
| 4,814,942 A | 3/1989 | Robirds et al. |
| 4,825,339 A | 4/1989 | Boudon |
| 4,869,380 A | 9/1989 | Metcalfe et al. |
| 4,941,717 A | 7/1990 | Beaulieu |
| 4,944,082 A | 7/1990 | Jones et al. |
| 4,962,443 A | 10/1990 | Cole |
| 4,964,020 A | 10/1990 | Savage et al. |
| 4,988,008 A | 1/1991 | Blum et al. |
| 5,004,107 A | 4/1991 | Sevier et al. |
| 5,009,383 A | 4/1991 | Chapman |
| 5,020,866 A | 6/1991 | McIlwraith |
| 5,052,565 A | 10/1991 | Zachrei |
| 5,149,026 A | 9/1992 | Allen |
| 5,165,770 A | 11/1992 | Hahn |
| 5,250,752 A | 10/1993 | Cutright |
| 5,263,252 A | 11/1993 | Bruggink |
| 5,275,296 A | 1/1994 | Zachrai |
| 5,284,254 A | 2/1994 | Rinderer |
| 5,294,748 A | 3/1994 | Schwenk et al. |
| 5,310,255 A | 5/1994 | Ranallo |
| 5,323,916 A | 6/1994 | Salmon |
| 5,333,950 A | 8/1994 | Zachrai |
| 5,372,262 A | 12/1994 | Benson et al. |
| 5,380,083 A | 1/1995 | Jones et al. |
| 5,380,803 A | 1/1995 | Coutant et al. |
| 5,460,441 A | 10/1995 | Hastings et al. |
| 5,488,543 A | 1/1996 | Mazura et al. |
| 5,497,444 A | 3/1996 | Wheeler |
| 5,498,073 A | 3/1996 | Charbonneau et al. |
| 5,536,079 A | 7/1996 | Kostic |
| 5,540,339 A | 7/1996 | Lerman |
| 5,542,549 A | 8/1996 | Siemon et al. |
| 5,566,836 A | 10/1996 | Lerman |
| 5,586,012 A | 12/1996 | Lerman |
| 5,639,150 A | 6/1997 | Anderson et al. |
| 5,640,482 A | 6/1997 | Barry et al. |
| 5,695,263 A | 12/1997 | Simon et al. |
| 5,713,651 A | 2/1998 | Essig et al. |
| 5,728,973 A | 3/1998 | Jorgensen |
| 5,758,002 A | 5/1998 | Walters |
| 5,791,498 A | 8/1998 | Mills |
| 5,798,485 A | 8/1998 | Rohde et al. |
| 5,806,811 A | 9/1998 | Viklund et al. |
| 5,806,945 A | 9/1998 | Anderson et al. |
| 5,806,946 A | 9/1998 | Benner et al. |
| 5,819,956 A | 10/1998 | Rinderer |
| 5,933,563 A | 8/1999 | Schaffer et al. |
| 5,938,302 A | 8/1999 | Anderson et al. |
| 5,954,525 A | 9/1999 | Siegal et al. |
| 5,961,081 A | 10/1999 | Rinderer |
| 5,975,315 A | 11/1999 | Jordan |
| 5,992,808 A | 11/1999 | Morrow |
| 5,997,117 A | 12/1999 | Krietzman |
| 6,008,621 A | 12/1999 | Madison et al. |
| 6,011,221 A | 1/2000 | Lecinski et al. |
| 6,019,446 A | 2/2000 | Laboch et al. |
| 6,036,290 A | 3/2000 | Jancsek et al. |
| 6,039,420 A | 3/2000 | Besserer et al. |
| 6,044,193 A | 3/2000 | Szetesi et al. |
| 6,047,838 A | 4/2000 | Rindoks et al. |
| 6,065,612 A | 5/2000 | Rinderer |
| 6,067,233 A | 5/2000 | English et al. |
| 6,095,345 A | 8/2000 | Gibbons |
| 6,103,973 A | 8/2000 | Sharp |
| 6,105,218 A | 8/2000 | Reekie |
| 6,118,073 A | 9/2000 | Lau et al. |
| 6,123,203 A | 9/2000 | Gibbons |
| 6,123,400 A | 9/2000 | Nicolai et al. |
| 6,129,316 A | 10/2000 | Bauer |
| 6,135,583 A | 10/2000 | Simon et al. |
| 6,155,658 A | 12/2000 | Woodward et al. |
| 6,179,398 B1 | 1/2001 | Martin |
| 6,181,549 B1 | 1/2001 | Mills et al. |
| 6,185,098 B1 | 2/2001 | Benavides |
| 6,201,919 B1 | 3/2001 | Puetz et al. |
| D440,210 S | 4/2001 | Larsen et al. |
| 6,220,554 B1 | 4/2001 | Daoud |
| 6,223,908 B1 | 5/2001 | Kurtsman |
| 6,227,502 B1 | 5/2001 | Derman |
| 6,231,142 B1 | 5/2001 | Pochet |
| 6,238,029 B1 | 5/2001 | Marzec et al. |
| 6,245,998 B1 | 6/2001 | Curry et al. |
| 6,254,207 B1 | 7/2001 | Leneutre |
| 6,282,854 B1 | 9/2001 | Vos et al. |
| 6,293,637 B1 | 9/2001 | Anderson et al. |
| 6,299,268 B1 | 10/2001 | Carle et al. |
| 6,313,405 B1 | 11/2001 | Rinderer |
| 6,315,132 B1 | 11/2001 | Hartel et al. |
| 6,321,917 B1 | 11/2001 | Mendoza |
| 6,327,150 B1 | 12/2001 | Levy et al. |
| 6,340,141 B1 | 1/2002 | Rinderer |
| 6,347,714 B1 | 2/2002 | Fournier et al. |
| 6,349,837 B1 | 2/2002 | Serban |

(56) References Cited

U.S. PATENT DOCUMENTS

| | | |
|---|---|---|
| 6,401,940 B1 | 6/2002 | Hartel et al. |
| 6,410,844 B1 | 6/2002 | Bruner et al. |
| 6,422,399 B1 | 7/2002 | Castillo et al. |
| 6,425,488 B1 | 7/2002 | Notohardjono et al. |
| 6,425,648 B1 | 7/2002 | Notohardjono et al. |
| 6,481,582 B1 | 11/2002 | Rinderer |
| 6,489,565 B1 | 12/2002 | Krietzman et al. |
| 6,502,702 B1 | 1/2003 | Hsue et al. |
| 6,504,100 B2 | 1/2003 | Lawrence et al. |
| 6,510,589 B2 | 1/2003 | Schrage |
| 6,513,770 B1 | 2/2003 | Franz et al. |
| 6,517,174 B2 | 2/2003 | Sevier |
| 6,527,351 B1 | 3/2003 | Sevier et al. |
| 6,541,705 B1 | 4/2003 | McGrath |
| 6,554,697 B1 | 4/2003 | Koplin |
| 6,561,602 B1 | 5/2003 | Sevier et al. |
| 6,565,166 B1 | 5/2003 | Bulk et al. |
| 6,570,754 B2 | 5/2003 | Foley et al. |
| 6,601,932 B1 | 8/2003 | Helgenberg et al. |
| 6,605,777 B1 | 8/2003 | Anderson et al. |
| 6,605,782 B1 | 8/2003 | Krietzman et al. |
| 6,629,505 B1 | 10/2003 | Cronk et al. |
| 6,632,999 B2 | 10/2003 | Sempliner et al. |
| 6,655,534 B2 | 12/2003 | Williams et al. |
| 6,677,530 B2 | 1/2004 | Blaha et al. |
| 6,695,149 B1 | 2/2004 | Cote et al. |
| 6,760,531 B1 | 7/2004 | Solheid et al. |
| 6,769,551 B2 | 8/2004 | Rafferty et al. |
| 6,785,459 B2 | 8/2004 | Schmidt et al. |
| 6,788,535 B2 | 9/2004 | Dodgen et al. |
| 6,791,841 B1 | 9/2004 | Tirrell et al. |
| 6,796,437 B2 | 9/2004 | Krampotich et al. |
| 6,796,438 B2 | 9/2004 | Mendoza |
| 6,796,623 B1 | 9/2004 | Fontana et al. |
| 6,808,240 B2 | 10/2004 | Altena |
| 6,814,417 B2 | 11/2004 | Hartel et al. |
| 6,866,154 B2 | 3/2005 | Hartman et al. |
| 6,884,942 B2 | 4/2005 | McGrath et al. |
| 6,902,069 B2 | 6/2005 | Hartman et al. |
| 6,920,038 B2 | 7/2005 | Gehlbach |
| 6,920,831 B2 | 7/2005 | Lin |
| 6,930,886 B2 | 8/2005 | Velez et al. |
| 6,945,616 B2 | 9/2005 | Webster et al. |
| 6,992,247 B2 | 1/2006 | Rasmussen et al. |
| 7,000,784 B2 | 2/2006 | Canty et al. |
| 7,086,707 B2 | 8/2006 | Wyatt et al. |
| 7,093,725 B2 | 8/2006 | Hartman et al. |
| 7,141,891 B2 | 11/2006 | McNally et al. |
| 7,144,320 B2 | 12/2006 | Turek et al. |
| 7,168,576 B2 | 1/2007 | Williams |
| 7,178,679 B2 | 2/2007 | Canty et al. |
| 7,188,735 B2 | 3/2007 | Nakagawa et al. |
| 7,204,371 B2 | 4/2007 | Woolsey et al. |
| 7,255,409 B2 | 8/2007 | Hu et al. |
| 7,255,640 B2 | 8/2007 | Aldag et al. |
| 7,285,027 B2 | 10/2007 | McGrath et al. |
| 7,293,666 B2 * | 11/2007 | Mattlin ............... G06F 1/181 |
| | | 211/189 |
| 7,312,980 B2 | 12/2007 | Ewing et al. |
| 7,316,461 B2 | 1/2008 | Wyatt et al. |
| 7,355,115 B2 | 4/2008 | Liang |
| 7,362,941 B2 | 4/2008 | Rinderer et al. |
| 7,364,243 B2 | 4/2008 | Wyatt et al. |
| 7,378,046 B2 | 5/2008 | Canty et al. |
| 7,406,242 B1 | 7/2008 | Braga |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| D584,251 S | 1/2009 | Lewis, II et al. |
| D584,252 S | 1/2009 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| D588,081 S | 3/2009 | Lewis, II et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| D592,618 S | 5/2009 | Lewis, II et al. |
| 7,527,226 B2 | 5/2009 | Kusuda et al. |
| 7,542,287 B2 | 6/2009 | Lewis, II et al. |
| D596,928 S | 7/2009 | Lawrence et al. |
| 7,567,430 B2 | 7/2009 | Ewing et al. |
| 7,592,541 B2 | 9/2009 | Adducci et al. |
| 7,637,771 B2 | 12/2009 | Laursen |
| 7,643,291 B2 | 1/2010 | Mallia et al. |
| 7,667,135 B2 | 2/2010 | Adducci et al. |
| D611,326 S | 3/2010 | Alaniz et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,719,835 B1 | 5/2010 | Schluter |
| 7,746,637 B2 | 6/2010 | Donowho et al. |
| 7,772,489 B2 | 8/2010 | Adducci et al. |
| 7,778,513 B2 | 8/2010 | Rinderer et al. |
| 7,795,532 B2 | 9/2010 | Walker |
| 7,804,685 B2 | 9/2010 | Krietzman |
| 7,815,246 B2 | 10/2010 | Nakamura et al. |
| 7,839,635 B2 | 11/2010 | Donowho et al. |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,939,763 B2 | 5/2011 | Jones et al. |
| 7,952,057 B2 | 5/2011 | Grelck |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,974,105 B2 | 7/2011 | Dean, Jr. et al. |
| 7,999,183 B2 * | 8/2011 | Garza ............... H04Q 1/09 |
| | | 174/100 |
| 8,003,890 B2 | 8/2011 | Donowho et al. |
| 8,014,171 B2 | 9/2011 | Kelly et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,056,868 B2 | 11/2011 | Vander Griend |
| 8,087,979 B2 | 1/2012 | Rasmussen |
| 8,107,238 B2 | 1/2012 | Krietzman et al. |
| 8,138,419 B2 | 3/2012 | Garza et al. |
| 8,281,940 B2 | 10/2012 | Fan |
| 8,330,043 B2 | 12/2012 | Alaniz et al. |
| 8,395,046 B2 * | 3/2013 | Nicewicz ............... H02B 1/202 |
| | | 174/17 R |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,437,147 B2 | 5/2013 | Dean, Jr. et al. |
| 8,443,987 B2 | 5/2013 | Peng et al. |
| 8,459,756 B2 | 6/2013 | Linhares et al. |
| 8,556,357 B2 * | 10/2013 | Fan ............... H05K 7/1489 |
| | | 312/265.4 |
| 8,653,363 B2 | 2/2014 | Behrens et al. |
| 8,730,665 B2 | 5/2014 | Lewis, II et al. |
| 8,757,560 B2 | 6/2014 | Darnell |
| 8,787,023 B2 | 7/2014 | Lewis, II et al. |
| 8,879,881 B2 | 11/2014 | Cote et al. |
| 8,901,438 B2 | 12/2014 | Lewis, II et al. |
| 9,055,677 B2 | 6/2015 | Garza, Jr. et al. |
| 9,112,341 B2 | 8/2015 | Eshima et al. |
| 9,351,427 B2 | 5/2016 | Lewis, II et al. |
| 9,363,922 B2 | 6/2016 | Larsen et al. |
| 9,402,329 B1 | 7/2016 | Chen et al. |
| 9,408,326 B2 | 8/2016 | Lewis, II et al. |
| 9,420,727 B2 | 8/2016 | Lewis, II et al. |
| 9,548,597 B2 | 1/2017 | Vacca et al. |
| 9,549,487 B2 | 1/2017 | Lewis, II et al. |
| 9,560,777 B2 | 1/2017 | Krietzman et al. |
| 9,572,286 B2 | 2/2017 | Greeson et al. |
| 9,642,270 B2 | 5/2017 | Lewis, II et al. |
| 9,781,852 B2 | 10/2017 | Garza, Jr. et al. |
| 9,795,060 B2 | 10/2017 | Greeson et al. |

(56) References Cited

U.S. PATENT DOCUMENTS

| | | |
|---|---|---|
| 9,814,159 B2 | 11/2017 | Lewis, II et al. |
| 9,949,406 B2 | 4/2018 | Lewis, II et al. |
| 9,955,616 B2 | 4/2018 | Krietzman et al. |
| 9,980,400 B2 | 5/2018 | Lewis, II et al. |
| 2001/0015598 A1 | 8/2001 | Sevier |
| 2002/0046979 A1 | 4/2002 | Larsen et al. |
| 2002/0074149 A1 | 6/2002 | Lawrence et al. |
| 2002/0172013 A1 | 11/2002 | Chandler |
| 2002/0197045 A1 | 12/2002 | Schmidt et al. |
| 2003/0034717 A1* | 2/2003 | Yao .................. G06F 1/183 312/223.1 |
| 2003/0037953 A1 | 2/2003 | Sarkinen et al. |
| 2003/0079897 A1 | 5/2003 | Sempliner et al. |
| 2003/0118311 A1 | 6/2003 | Thibault et al. |
| 2004/0007372 A1 | 1/2004 | Krietzman et al. |
| 2004/0016708 A1 | 1/2004 | Rafferty et al. |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0069725 A1 | 4/2004 | Adducci et al. |
| 2004/0146266 A1 | 7/2004 | Solheid et al. |
| 2004/0173545 A1 | 9/2004 | Canty et al. |
| 2004/0183409 A1 | 9/2004 | Rinderer |
| 2004/0190270 A1 | 9/2004 | Aldag et al. |
| 2004/0201335 A1 | 10/2004 | Davis |
| 2004/0226900 A1 | 11/2004 | Canty et al. |
| 2004/0231875 A1 | 11/2004 | Rasmussen et al. |
| 2005/0103734 A1 | 5/2005 | Saltzberg et al. |
| 2005/0221683 A1 | 10/2005 | McGrath et al. |
| 2005/0247650 A1 | 11/2005 | Vogel et al. |
| 2006/0043031 A1 | 3/2006 | Rinderer |
| 2006/0087792 A1 | 4/2006 | Ng et al. |
| 2006/0103270 A1 | 5/2006 | Bergesch et al. |
| 2006/0118321 A1 | 6/2006 | Herring et al. |
| 2006/0141921 A1 | 6/2006 | Turek et al. |
| 2006/0162948 A1 | 7/2006 | Rinderer et al. |
| 2006/0213853 A1 | 9/2006 | Schluter et al. |
| 2007/0064389 A1 | 3/2007 | Lewis, II et al. |
| 2007/0064391 A1 | 3/2007 | Lewis, II et al. |
| 2007/0081874 A1 | 4/2007 | Kamino et al. |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0130262 A1 | 6/2008 | Rinderer et al. |
| 2008/0174217 A1 | 7/2008 | Walker |
| 2008/0180004 A1 | 8/2008 | Martich et al. |
| 2008/0266789 A1 | 10/2008 | Hruby et al. |
| 2008/0271918 A1 | 11/2008 | Caveney et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0151983 A1 | 6/2009 | Sempliner et al. |
| 2009/0168306 A1 | 7/2009 | Sharp et al. |
| 2009/0190307 A1 | 7/2009 | Krietzman |
| 2009/0224110 A1 | 9/2009 | Donowho et al. |
| 2009/0227197 A1 | 9/2009 | Lewis, II et al. |
| 2009/0236117 A1 | 9/2009 | Garza et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2009/0283488 A1 | 11/2009 | McMillan, III et al. |
| 2010/0051308 A1 | 3/2010 | Hansen et al. |
| 2010/0061059 A1 | 3/2010 | Krietzman et al. |
| 2010/0084188 A1 | 4/2010 | Rajvanshi et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0056895 A1 | 3/2011 | Tichy |
| 2011/0083873 A1 | 4/2011 | Hartman et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0278060 A1 | 11/2011 | Rajvanshi et al. |
| 2011/0278250 A1 | 11/2011 | Malekmadani |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0049706 A1 | 3/2012 | Cottuli et al. |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0181906 A1 | 7/2012 | Caveney |
| 2012/0305307 A1 | 12/2012 | Korcz et al. |
| 2013/0069501 A1 | 3/2013 | Liu |
| 2013/0160271 A1 | 6/2013 | Krietzman et al. |
| 2013/0165035 A1 | 6/2013 | Krietzman et al. |
| 2013/0309957 A1 | 11/2013 | Fleming et al. |
| 2014/0034593 A1 | 2/2014 | Chen et al. |
| 2014/0132134 A1 | 5/2014 | Garza, Jr. et al. |
| 2014/0319084 A1 | 10/2014 | Lewis, II et al. |
| 2015/0069888 A1 | 3/2015 | Lewis, II et al. |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0333303 A1 | 11/2015 | Hachiya et al. |
| 2015/0342082 A1 | 11/2015 | Roehrl et al. |
| 2016/0088773 A1 | 3/2016 | Greeson et al. |
| 2016/0262277 A1 | 9/2016 | Lewis, II et al. |
| 2017/0127570 A1 | 5/2017 | Lewis, II et al. |
| 2017/0142851 A1 | 5/2017 | Krietzman et al. |
| 2017/0150652 A1 | 5/2017 | Greeson et al. |
| 2017/0223865 A1 | 8/2017 | Lewis, II et al. |
| 2017/0332501 A1 | 11/2017 | Lewis, II et al. |
| 2018/0027677 A1 | 1/2018 | Garza, Jr. et al. |
| 2018/0035570 A1 | 2/2018 | Greeson et al. |
| 2018/0110153 A1 | 4/2018 | Hennrich et al. |
| 2018/0270968 A1 | 9/2018 | Lewis, II et al. |

FOREIGN PATENT DOCUMENTS

| | | |
|---|---|---|
| DE | 7836374 | 3/1979 |
| DE | 19615759 A1 | 10/1997 |
| DE | 20207426 U1 | 9/2002 |
| EC | 000663943-0001 | 7/2007 |
| EC | 000663943-0002 | 7/2007 |
| EC | 000663943-0003 | 7/2007 |
| EC | 000663943-0004 | 7/2007 |
| EP | 0577433 | 1/1994 |
| EP | 2205054 A1 | 7/2010 |
| EP | 2429271 | 3/2012 |
| EP | 2429272 | 3/2012 |
| GB | 2366084 B | 9/2002 |
| GB | 2468823 B | 10/2012 |
| SE | 535066 C2 | 4/2012 |

(56) References Cited

FOREIGN PATENT DOCUMENTS

| WO | 2001001533 A1 | 1/2001 |
|---|---|---|
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089307 A2 | 7/2009 |
| WO | 2009103090 A2 | 8/2009 |
| WO | 2009103090 A3 | 10/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |
| WO | 2018022721 A1 | 2/2018 |

OTHER PUBLICATIONS

Information Disclosure Statement (IDS) Letter Regarding Common Patent Applications(s), dated Aug. 16, 2017.
Chatsworth Products, Inc., "Thermal Management Solutions," Signature Solutions Brochure, revision dated Mar. 2008, www.chatsworth.com/passivecooling (6 pages).
"European Search Report," European Patent Application No. 11275109.4 for Chatsworth Products, Inc., dated Sep. 18, 2014 (5 pages).
Rack Technologies Pty Ltd, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).
Panduit Corporation, Panduit Net-Access Vertical Exhaust Duct (VED) Instructions, dated 2009 (4 pages).
Panduit Corporation, Panduit Net-Access Vertical Exhaust System (VES) Specification Sheet, dated Feb. 2011 (4 pages).
Hewlett-Packard Development Company, LP, HP 10000 G2 42U Rack Air Duct Installation Guide, dated Aug. 2008 (23 pages).
Chatsworth Products, Inc. "Cabinet Airflow Baffles—Air Dam Kit for CPI Cabinet Systems," Product Data Sheet, Jun. 2004, techsupport@chatsworth.com (2 pages).
Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knurr%20DCD/Smart-Cooling-Solutions-Data-Center-EN.pdf> (51 pages).
Information Disclosure Statement (IDS) Letter Regarding Common Patent Application(s), dated Apr. 18, 2018.
Information Disclosure Statement (IDS) Letter Regarding Common Patent Application(s), dated Oct. 25, 2018.

* cited by examiner

VERTICAL MOUNTING RAIL WITH CABLE MANAGEMENT FEATURES

CROSS-REFERENCE TO RELATED APPLICATIONS

The present application is a U.S. continuation patent application of, and claims priority under 35 U.S.C. § 120 to, U.S. nonprovisional patent application Ser. No. 15/062,372, filed Mar. 7, 2016, which '372 application published as U.S. Patent Application Publication No. US 2016/0262277 A1 on Sep. 8, 2016 and issued as U.S. Pat. No. 9,642,270 on May 2, 2017, which '372 application, the application publication thereof, and the patent issuing therefrom are each incorporated by reference herein in their entirety, and which '372 application is a U.S. continuation patent application of, and claims priority under 35 U.S.C. § 120 to, U.S. nonprovisional patent application Ser. No. 14/541,507, filed Nov. 14, 2014, which '507 application published as U.S. Patent Application Publication No. US 2015/0069888 A1 on Mar. 12, 2015 and issued as U.S. Pat. No. 9,408,326 on Aug. 2, 2016, which '507 application, the application publication thereof, and the patent issuing therefrom are each incorporated by reference herein in their entirety, and which '507 application is a U.S. continuation patent application of, and claims priority under 35 U.S.C. § 120 to, U.S. nonprovisional patent application Ser. No. 13/229,704, filed Sep. 10, 2011, which '704 application published as U.S. Patent Application Publication No. US 2012/0062084 A1 on Mar. 15, 2012 and issued as U.S. Pat. No. 8,901,438 on Dec. 2, 2014, which '704 application, the application publication thereof, and the patent issuing therefrom are each incorporated by reference herein in their entirety, and which '704 application is a U.S. nonprovisional patent application of, and claims priority under 35 U.S.C. § 119(e) to, U.S. provisional patent application Ser. No. 61/381,904, filed Sep. 10, 2010, which '904 application is incorporated by reference herein in its entirety. Additionally, each of the following U.S. patent applications, and any application publication thereof, is incorporated by reference herein in its entirety:

(a) U.S. provisional patent application Ser. No. 61/381,905, filed Sep. 10, 2010, and entitled, "CABLE PASS-THROUGH PANEL FOR ELECTRONIC EQUIPMENT ENCLOSURE;"

(b) U.S. provisional patent application Ser. No. 61/381,909, filed Sep. 10, 2010, and entitled, "RAIL SEAL FOR ELECTRONIC EQUIPMENT ENCLOSURE;"

(c) U.S. provisional patent application Ser. No. 61/381,912, filed Sep. 10, 2010, and entitled, "RAIL MOUNTING CLAMP FOR ELECTRONIC EQUIPMENT ENCLOSURE;"

(d) U.S. provisional patent application Ser. No. 61/381,918, filed Sep. 10, 2010, and entitled, "VERTICAL MOUNTING RAIL WITH CABLE MANAGEMENT FEATURES;"

(e) U.S. non-provisional patent application Ser. No. 13/229,705, filed Sep. 10, 2011, published on Mar. 15, 2012 as U.S. Patent Application Publication No. US 2012/0062086 A1, and entitled, "CABLE PASS-THROUGH PANEL FOR ELECTRONIC EQUIPMENT ENCLOSURE;"

(f) U.S. non-provisional patent application Ser. No. 13/229,706, filed Sep. 10, 2011, published on Mar. 15, 2012 as U.S. Patent Application Publication No. US 2012/0063099 A1, and entitled, "RAIL SEAL FOR ELECTRONIC EQUIPMENT ENCLOSURE;"

(g) U.S. non-provisional patent application Ser. No. 13/229,707, filed Sep. 10, 2011, published on Mar. 15, 2012 as U.S. Patent Application Publication No. US 2012/0062083 A1, entitled, "RAIL MOUNTING CLAMP FOR ELECTRONIC EQUIPMENT ENCLOSURE," and issued on Jul. 22, 2014 as U.S. Pat. No. 8,787,023; and (h) U.S. non-provisional patent application Ser. No. 13/229,708, filed Sep. 10, 2011, published on Mar. 15, 2012 as U.S. Patent Application Publication No. US 2012/0062091 A1, and entitled, "VERTICAL MOUNTING RAIL WITH CABLE MANAGEMENT FEATURES."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to the field of racks, frames and cabinets for mounting and storing electronic components, and, more particularly, to reduced-complexity structures with high strength and capacity.

Background

Racks, frames and cabinets for mounting and storing electronic components have been well known for many years. Frames and racks are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons. Racks, frames and cabinets (sometimes collectively referred to hereinafter as "enclosures") have been built in many different sizes and with many different proportions in order to best accommodate the components which they are designed to store.

Various aspects of these enclosures have increased part counts and weight and created additional cost and manufacturing complications. In one example, cable management accessories and equipment are mounted in an enclosure on a bracket that is attached to a vertically-oriented equipment mounting rail. Because the bracket is a separate structural component from the vertical mounting rail, these structures occupy greater space within the enclosure. Additionally, such structures typically result in greater cost due to the extra materials and hardware components necessary to install the separate bracket.

Accordingly, a need exists for improved design and manufacturability in racks, frames and cabinets in order to enhance the utilization of space within an enclosure and reduce manufacturing and assembly costs.

SUMMARY OF THE PRESENT INVENTION

The present invention includes many aspects and features. Moreover, while many aspects and features relate to, and are described in, the context of enclosures for electronic equipment, the present invention is not limited to use only in enclosures for electronic equipment, as will become apparent from the following summaries and detailed descriptions of aspects, features, and one or more embodiments of the present invention.

Broadly defined, the present invention according to a first aspect includes an electronic equipment enclosure having a frame structure that includes side cross members between front and rear frames, a vertical mounting rail fastened to the frame structure, and one or more cable management structures. The vertical mounting rail includes a fastening surface, for interfacing with the frame structure, and first, second and third support surfaces located successively adjacent one another and away from the fastening surface. One or more cable management structures are mounted to at least one of the first or second support surfaces.

In features of this aspect, the first, second and third support surfaces may be arranged at right angles relative to one another; and the second support surface may have a width greater than that of the first or third support surfaces.

In further features of this aspect, the third support surface may be an equipment mounting rail; and the equipment mounting rail may include a plurality of apertures extending therethrough for mounting cable management equipment thereto.

In still further features of this aspect, the one or more cable management structures may include at least one D-ring; the at least one D-ring may be mounted on the first support surface; and the first support surface may include a plurality of keyhole apertures for accommodating corresponding keyhole bosses of the at least one D-ring.

In still further features of this aspect, the one or more cable management structures may include at least one multi-fingered cable guide; and the at least one multi-fingered cable guide may be mounted on the second support surface.

In another feature of this aspect, the one or more cable management structures may include at least one D-ring mounted on the first support surface and at least one multi-fingered cable guide mounted on the second support surface.

Broadly defined, the present invention according to a second aspect includes an electronic equipment enclosure substantially as shown and described.

Broadly defined, the present invention according to a third aspect includes a vertical mounting rail for fastening in an electronic equipment enclosure. The vertical mounting rail includes a fastening surface, for interfacing with a frame structure, and first, second and third support surfaces located successively adjacent one another and away from the fastening surface. One or more cable management structures are mountable to at least one of the first or second support surfaces.

In features of this aspect, the first, second and third support surfaces may be arranged at right angles relative to one another; and the second support surface may have a width greater than that of the first or third support surfaces.

In further features of this aspect, the third support surface may be an equipment mounting rail; and the equipment mounting rail may include a plurality of apertures extending therethrough for mounting cable management equipment thereto.

In still further features of this aspect, the one or more cable management structures may include at least one D-ring; the at least one D-ring may be mountable on the first support surface; and the first support surface may include a plurality of keyhole apertures for accommodating corresponding keyhole bosses of the at least one D-ring.

In still further features of this aspect, the one or more cable management structures may include at least one multi-fingered cable guide; and the at least one multi-fingered cable guide may be mountable on the second support surface.

In another feature of this aspect, the one or more cable management structures may include at least one D-ring mountable on the first support surface and at least one multi-fingered cable guide mountable on the second support surface.

Broadly defined, the present invention according to a fourth aspect includes a vertical mounting rail, for fastening in an electronic equipment enclosure, as substantially shown and described.

Broadly defined, the present invention according to a fifth aspect includes a method of accomplishing cable management in an electronic equipment enclosure, substantially as shown and described.

Broadly defined, the present invention according to a sixth aspect includes an electronic equipment enclosure that includes a frame structure that includes side cross members between front and rear frames, a vertical mounting rail fastened to the frame structure, and a first cable management structure. The vertical mounting rail includes a fastening portion, for interfacing with the frame structure, and at least one support portion including an aperture therein. The first cable management structure has a boss adapted to be maneuvered into the aperture and seated therein so as to fasten, without a separate fastener, the first cable management structure to the at least one support portion.

In features of this aspect, the first cable management structure may be adapted to be snap-fit to the at least one support portion; and the first cable management structure may be adapted to be fastened to the at least one support portion without the aid of tools.

In further features of this aspect, a second cable management structure having a boss may be adapted to be maneuvered into another aperture of the at least one support portion, and seated therein, so as to fasten, without a separate fastener, the second cable management structure to the at least one support portion; the second cable management structure may be of the same type as that of the first cable management structure; and the second cable management structure may be of a different type than that of the first cable management structure.

In further features of this aspect, the aperture of the at least one support portion may have a keyhole shape; and the at least one support portion may be an equipment mounting rail.

In further features of this aspect, the at least one support portion may include first, second and third support portions located successively adjacent one another; the first, second and third support portions may be arranged at right angles relative to one another; the second support portion may have a width greater than that of the first or third support portions; a second cable management structure may be fastened to the same support portion as that of the first cable management structure; and a second cable management structure may be fastened to a different support portion than that of the first cable management structure.

In still further features of this aspect, the first cable management structure may be a D-ring; the first cable management structure may be a multi-fingered cable guide; the first cable management structure may be a T-channel cable manager array; the first cable management structure may be a cable manager spool; and the first cable management structure may be a vertical C-channel cable manager.

Broadly defined, the present invention according to a seventh aspect includes a vertical mounting rail for fastening in an electronic equipment enclosure. The vertical mounting rail includes a fastening portion for interfacing with a frame structure and at least one support portion including an aperture therein adapted to receive and seat a boss of a first cable management structure, thereby fastening the first cable management structure to the at least one support portion without a separate fastener.

In features of this aspect, the at least one support portion may be adapted to permit the first cable management structure to be snap-fitted thereto; and the at least one support portion may be adapted to permit the first cable management structure to be fastened thereto without the aid of tools.

In further features of this aspect, the at least one support portion may include another aperture therein adapted to receive and seat the boss of a second cable management structure, thereby fastening the second cable management structure to the at least one support portion without a separate fastener; the second cable management structure may be of the same type as that of the first cable management structure; and the second cable management structure may be of a different type than that of the first cable management structure.

In further features of this aspect, the aperture of the at least one support portion may have a keyhole shape; and the at least one support portion may be an equipment mounting rail.

In further features of this aspect, the at least one support portion may include first, second and third support portions located successively adjacent one another; the first, second and third support portions may be arranged at right angles relative to one another; the second support portion may have a width greater than that of the first or third support portions; and any of the first, second and third support portions may be adapted to support the first cable management structure.

In still further features of this aspect, the first cable management structure may be a D-ring; the first cable management structure may be a multi-fingered cable guide; the first cable management structure may be a T-channel cable manager array; the first cable management structure may be a cable manager spool; and the first cable management structure may be a vertical C-channel cable manager.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
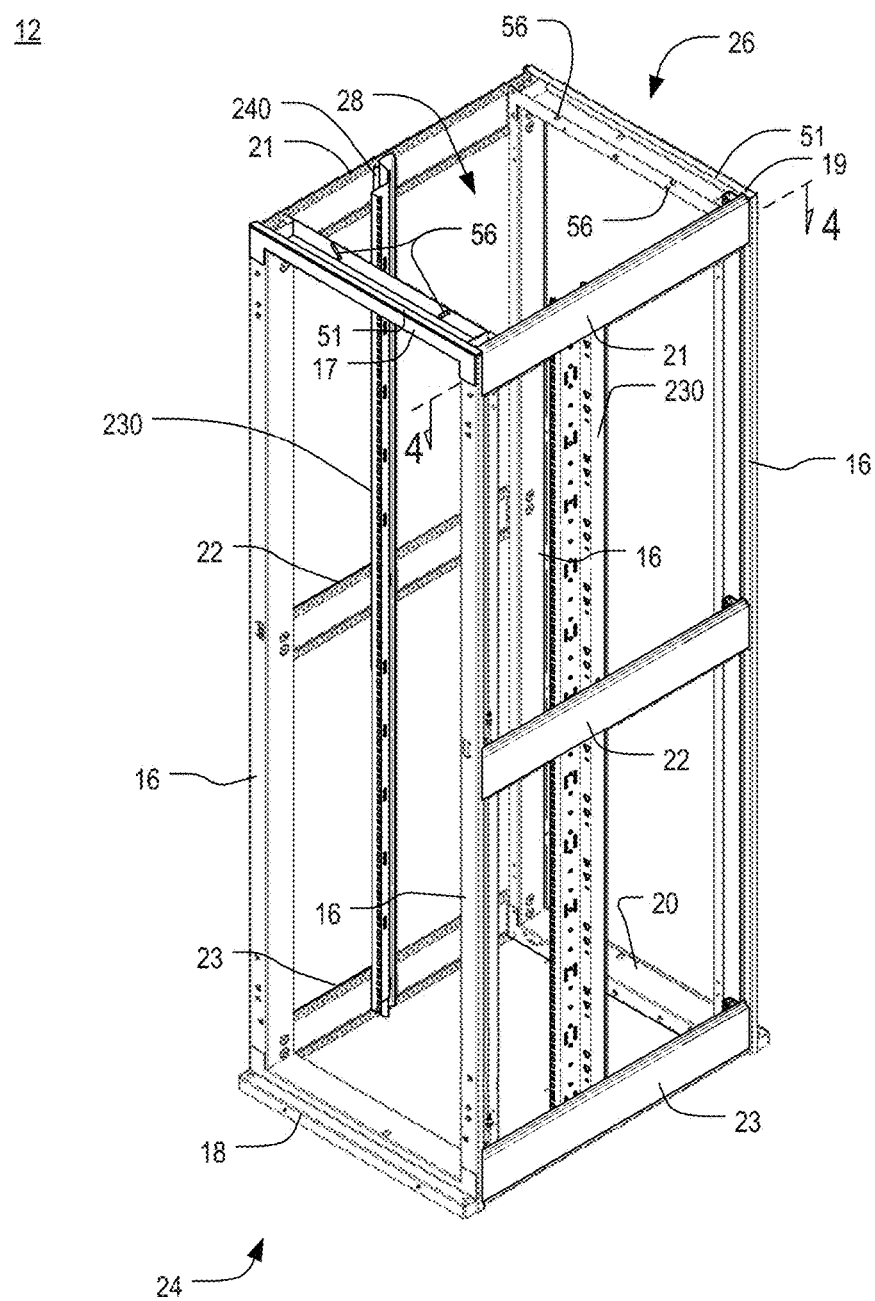
FIG. 1 is a front isometric view of an electronic equipment enclosure frame in accordance with one or more preferred embodiments of the present invention, shown with a pair of vertical mounting rails installed thereon.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiments is merely exemplary in nature and is in no way intended to limit the invention, its implementations, or uses.

FIG. 1 is a front isometric view of an electronic equipment enclosure frame 12 in accordance with one or more preferred embodiments of the present invention, shown with a pair of vertical mounting rails 230 installed thereon. As shown therein, the frame structure 12 includes four vertical support posts 16, upper and lower front cross members 17,18, upper and lower rear cross members 19,20 and three pairs of side cross members 21,22,23. Each vertical support post 16 includes a plurality of cross member attachment apertures at each end. Two of the vertical support posts 16 are connected together at their upper and lower ends by the upper and lower front cross members 17,18, respectively, and the other two support posts 16 are connected together at their upper and lower ends by the upper and lower rear cross members 19,20, respectively. The front cross members 17,18 and their respective support posts 16 thus define a front frame (sometimes referred to as a door threshold frame) 24, and the rear cross members 19,20 and their respective support posts 16 define a rear door threshold frame 26. The front and rear frames 24,26 may then be connected together at their respective corners by the upper, middle and lower side cross members 21,22,23.

Although not specifically identified in FIG. 1, each upper and lower cross member 17,19 and 18,20 includes a plurality of tabs or gussets, adapted to interact with a respective end of a vertical support post 16, extending therefrom, and these tabs may be plug welded to the vertical support posts 16. Such an arrangement may be disclosed, for example, in co-pending, commonly-assigned non-provisional patent application Ser. No. 13/229,704, entitled, "ELECTRONIC EQUIPMENT CABINET STRUCTURE" (the "'704 application"). Furthermore, the lower corners of each frame 24,26 may be reinforced and supported by caster plates which in turn are supported by casters. Such an arrangement may also be disclosed, for example, in the '704 application.

Although the particular frame structure 12 described and illustrated herein includes various novel aspects, it will be apparent to the Ordinary Artisan that some aspects of the present invention are likewise applicable to frame structures having one or more elements of generally conventional design and construction. Furthermore, in some embodiments, other frame elements may be used, other connection means may be used to join the various members together, or both. In this regard, other examples of conventional connection means are described in commonly-assigned U.S. Pat. No. 6,185,098, U.S. Pat. No. 7,119,282, U.S. Pat. No. 7,697,285, U.S. Patent Application Publication No. US 2009/0190307 A1, U.S. Patent Application Publication No. US 2009/0227197 A1, U.S. Patent Application Publication No. US 2009/0283488 A1, and U.S. Patent Application Publication No. US 2010/0172092 A1, the entirety of each of which is incorporated herein by reference. Although likewise not illustrated herein, the precision and the stability of each of the corners of at least some types of four post frame structures may be enhanced by utilizing a self-squaring corner attachment bracket such as that disclosed by commonly-assigned U.S. Pat. No. 5,997,117, entitled "RACK FRAME CABINET," the entirety of which is hereby incorporated by reference.

Figure 2:
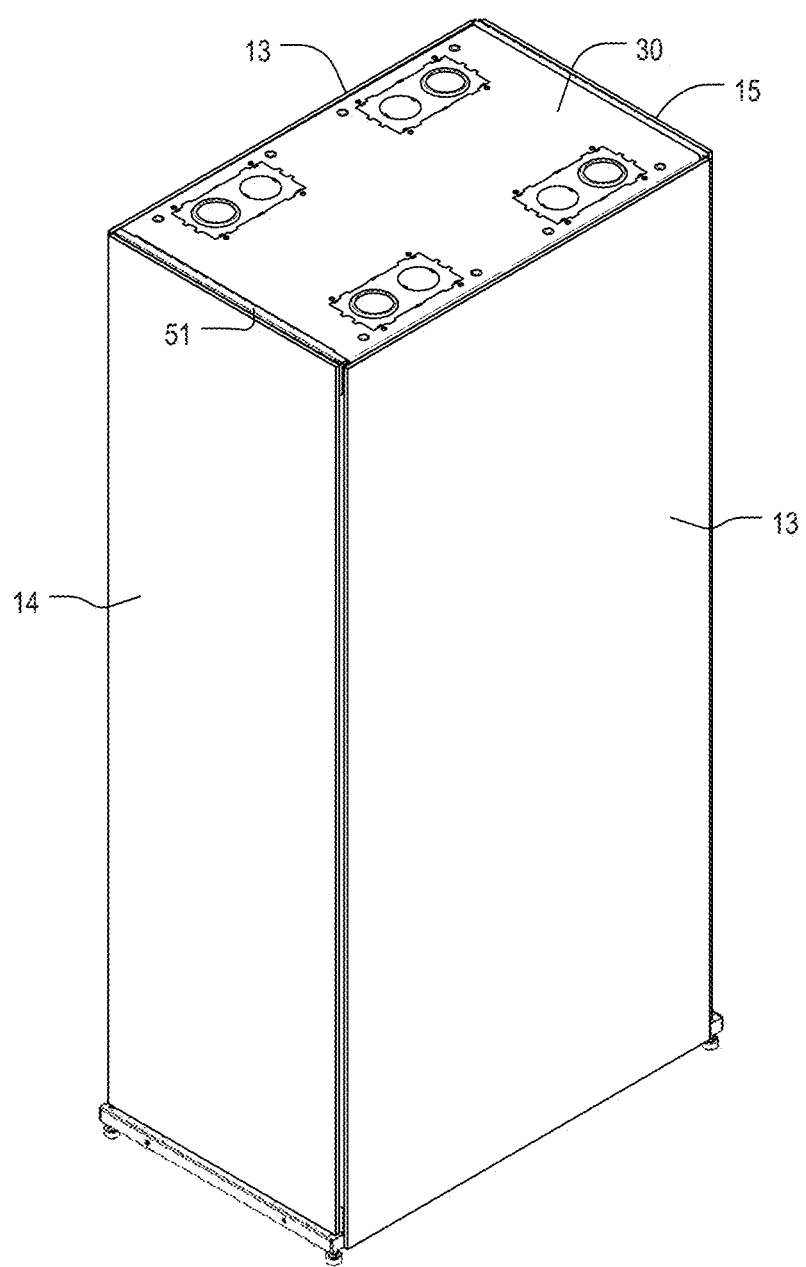
FIG. 2 is an isometric view of a frame structure of similar construction to that of FIG. 1, but of greater depth, shown with panels installed thereon.

The frame structure 12 may be enclosed by one or more panels to form an electronic equipment enclosure 10. FIG. 2 is an isometric view of a frame structure 12 of similar construction to that of FIG. 1, but of greater depth, shown with panels installed thereon. As shown therein, the enclosure 10 may include right and/or left panels 13, a front panel 14, and a rear panel 15, one or more of which may be configured to operate as a door to the interior of the enclosure 10 (not illustrated). Various different connection means may be used to join the various panels 13,14,15 to the frame structure 12. One or more novel connection means may be described and/or illustrated herein. However, although not illustrated herein, it will be apparent to the Ordinary Artisan that in at least some embodiments, any of a variety of other connection means may be used instead to join the panels to the frame structure 12.

The enclosure 10 further includes a generally flat top panel 30 sized and shaped to fit an opening 28 defined by the four vertical support posts 16 in connection with the upper front cross member 17, the upper rear cross member 19, and the upper side cross members 21. When installed, the top panel 30 covers the opening 28. In a contemplated embodiment, the top panel 30 is manufactured from sheet metal or other metal-based material. The top panel 30 may include features such as those described in co-pending, commonly-assigned non-provisional patent application Ser. No. 13/229,705, entitled, "CABLE PASS-THROUGH PANEL FOR ELECTRONIC EQUIPMENT ENCLOSURE" (the "'705 application").

In a contemplated embodiment, the upper front and rear cross members 17,19 each include two spring pins 56 and a retaining flange 51 as seen, for example, in FIG. 1. As described in the '705 application, the spring pins 56 and end flanges 51 may be utilized to facilitate reversible, tool-free installation of the top panel 30.

As shown in FIG. 1, the frame structure 12 further includes one or more vertical mounting rails 230 that extend therein in a generally vertical orientation. Each vertical mounting rail 230 typically has a series of holes 232 formed therein to facilitate easy mounting of a wide variety of equipment to the frame structure 12. As will be explained in greater detail, one or more mounting clamps 240 may be used to facilitate attachment of the vertical mounting rail 230 to the frame structure 12. Other examples of frame structures with vertical mounting rails are described in commonly-assigned U.S. Pat. No. 5,997,117, U.S. Pat. No. 7,839,635, U.S. Pat. No. 7,804,685, U.S. Patent Application Publication No. US 2009/0227197 A1, and U.S. Patent Application Publication No. US 2011/0148261 A1, the entirety of each of which is incorporated herein by reference. It will be appreciated that, in various embodiments, and as illustrated in the above-referenced patents and patent application publications and elsewhere, vertical mounting rails may be supported by the side cross members of the frame, by separate side horizontal rails that are not part of the primary frame structure, or by other means entirely.

Figures 3, 4:
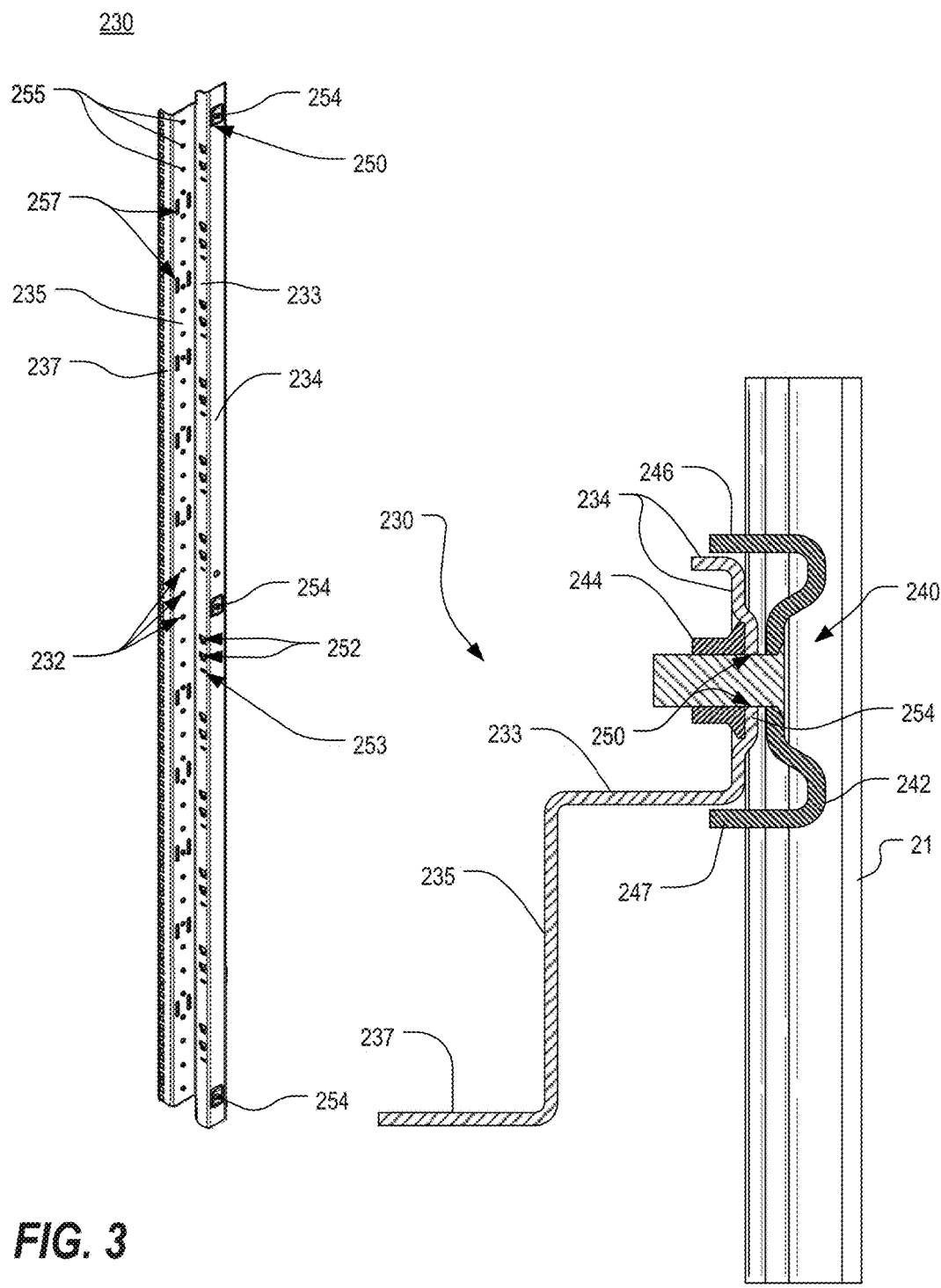
FIG. 3 is an isometric view of one of the vertical mounting rails of FIG. 1.
FIG. 4 is a top cross-sectional view of a portion of the frame structure of FIG. 1, taken along line 4-4, showing the connection of one of the mounting rails to one of the side cross members.

FIG. 3 is an isometric view of one of the vertical mounting rails 230 of FIG. 1, and FIG. 4 is a top cross-sectional view of a portion of the frame structure 12 of FIG. 1, taken along line 4-4, showing the connection of one of the mounting rails 230 to one of the side cross members 21. The mounting rail 230 in FIG. 3 is shown in the same orientation as that of the rightmost mounting rail 230 of FIG. 1. As shown therein, the vertical mounting rail 230 is an elongate structure whose cross-section generally includes a C-shaped portion 234, a first support portion 233 extending from one end of the C-shaped portion 234, a second support portion 235 extending perpendicularly from the first support portion 233, and a third support portion 237 extending perpendicularly from the second support portion 235.

Each vertical mounting rail 230 may be fastened to the cabinet structure 12 using one or more clamps 240. In this regard, the mounting clamp 240 includes a clamping bracket 242 and a clamp nut 244, and the rail 230 includes a plurality of embossed portions 254 for interfacing with the clamp 240. Extending at opposite lateral edges of the clamping bracket 242 are flanges 246,247. The flanges 246,247 of the clamping bracket 242 straddle the C-shaped portion 234 of the vertical mounting rail 230, and the clamp nut 244 may be aligned with the embossed portion 254 of the vertical mounting rail 230, which itself is aligned with a raised central portion of the clamping bracket 242. These features, and a clamp 240 suitable for use in one or more preferred embodiments of the present invention, are described and illustrated in co-pending, commonly-assigned non-provisional patent application Ser. No. 13/229,707, entitled, "RAIL MOUNTING CLAMP FOR ELECTRONIC EQUIPMENT ENCLOSURE." However, it will be apparent that in at least some embodiments, alternative side cross member structures, connection means, or both may be utilized to connect the vertical mounting rails 230 to the frame structure 12.

Figure 5:
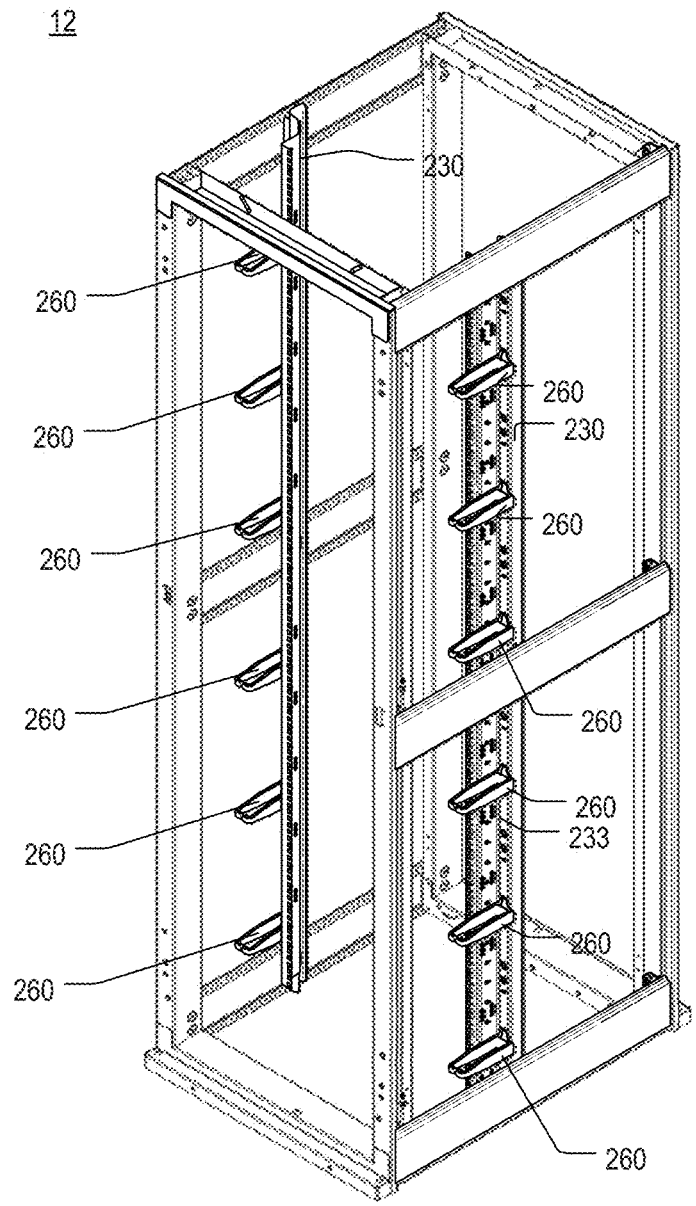
FIG. 5 is an isometric view of the frame structure of FIG. 1, shown with a plurality of D-rings mounted on each vertical mounting rail.
Figure 6:
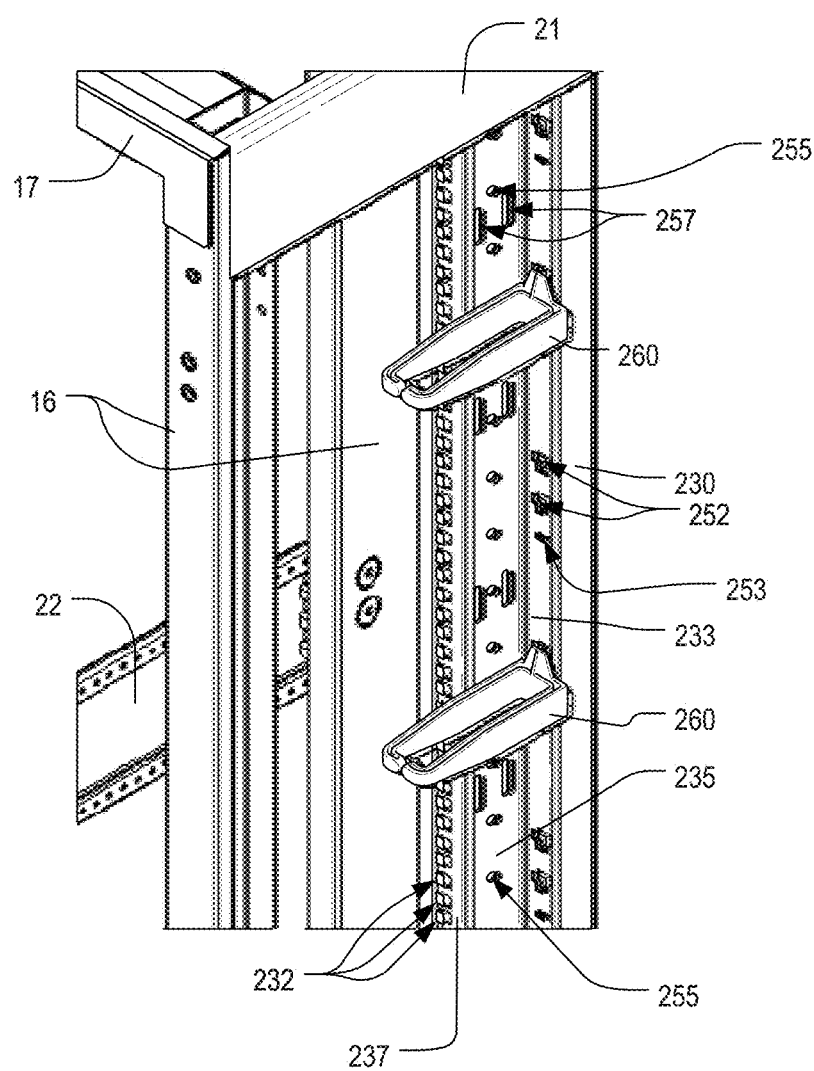
FIG. 6 is an enlarged fragmentary isometric view of the top right corner of the frame structure of FIG. 5.

A variety of mounting features is disposed along each of the first, second and third support portions 233,235,237; such features may be used for mounting equipment as well as cable management structures. In this regard, FIG. 5 is an isometric view of the frame structure 12 of FIG. 1, shown with a plurality of D-rings 260 mounted on each vertical mounting rail 230, and FIG. 6 is an enlarged fragmentary isometric view of the top right corner of the frame structure 12 of FIG. 5. With particular reference to FIGS. 3, 5 and 6, the first support portion 233 includes two types of openings 252,253, arranged in sets. In each set are two keyhole apertures 252 disposed above a single horizontal slot 253. The second support portion 235 also includes two types of openings 255,257; circular openings 255 are arranged in a column and evenly-spaced along the length of the rail 230, and vertical slots 257 are arranged in pairs that are likewise evenly-spaced, though at greater spacings, along the rail 230. Finally, the third support portion 237 includes the equipment mounting holes 232 mentioned previously. These holes are preferably square, but may alternatively be round, and are arranged in a conventional, standardized repeating pattern having intervals (on center) of ⅝"-⅝"-½" totaling a standard rack mounting unit ("RMU") of 1.75". The third support portion 237 thus serves as an equipment mounting rail, suitable for use in like manner to conventional equipment mounting rails having conventionally-spaced mounting apertures like those shown and described herein.

Figure 7:
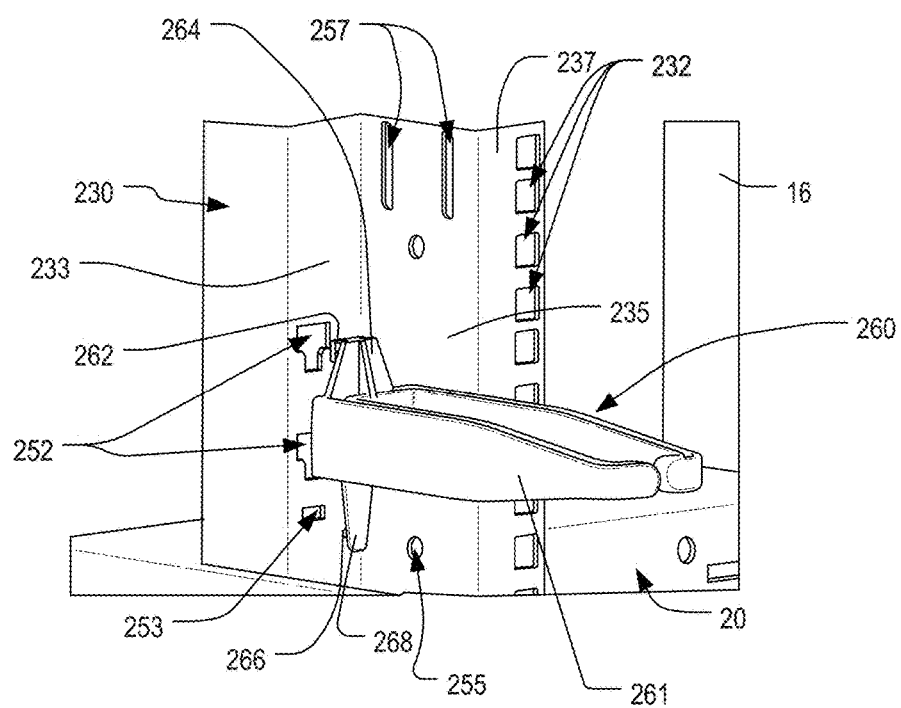
FIG. 7 is an enlarged fragmentary orthogonal view of one of the D-rings of FIG. 5 shown detached from the vertical mounting rail.

In FIGS. 5 and 6, the cable management structures that are mounted on the vertical mounting rails are D-rings 260, although a wide variety of different cable management structures may be mounted to the vertical mounting rails, as will be explained in further detail below. FIG. 7 is an enlarged fragmentary orthogonal view of one of the D-rings 260 of FIG. 5 shown detached from the vertical mounting rail 230. Each D-ring 260 includes a ring portion 261 and a support portion. The ring portion 261 may be generally similar in construction to, for example, cable rings described and illustrated in commonly-assigned U.S. Pat. No. 6,504,100, entitled "FLEXIBLE INTRA-CABINET CABLE RING WIRE MANAGEMENT SYSTEM," the entirety of which is incorporated herein by reference. However, in some embodiments, other types of cable rings may be substituted therefor. The support portion includes three elements: a first keyhole boss 262 extending laterally from the back of a tab 264 protruding upward from the back of the ring portion 261, a second keyhole boss (not visible, but similar to the first keyhole boss 262) extending laterally from the back of the ring portion 261, and an alignment boss 266 protruding from the end of a tab 268 extending downward from the back of the ring portion 261. The support portion of the D-ring 260 is adapted to be connected to, and supported by, one set of openings 252,253 in the vertical mounting rail 230 without interfering with the use of the equipment mounting holes 232. In particular, the two keyhole bosses 262 are arranged to interact with the keyhole apertures 252, of the selected set of openings 252,253, in the first support portion 233, and the alignment boss 266 is arranged to interact with the horizontal slot 253 of the same set of openings 252,253. This interaction may perhaps be best discerned from FIGS. 6 and 7.

Figure 8:
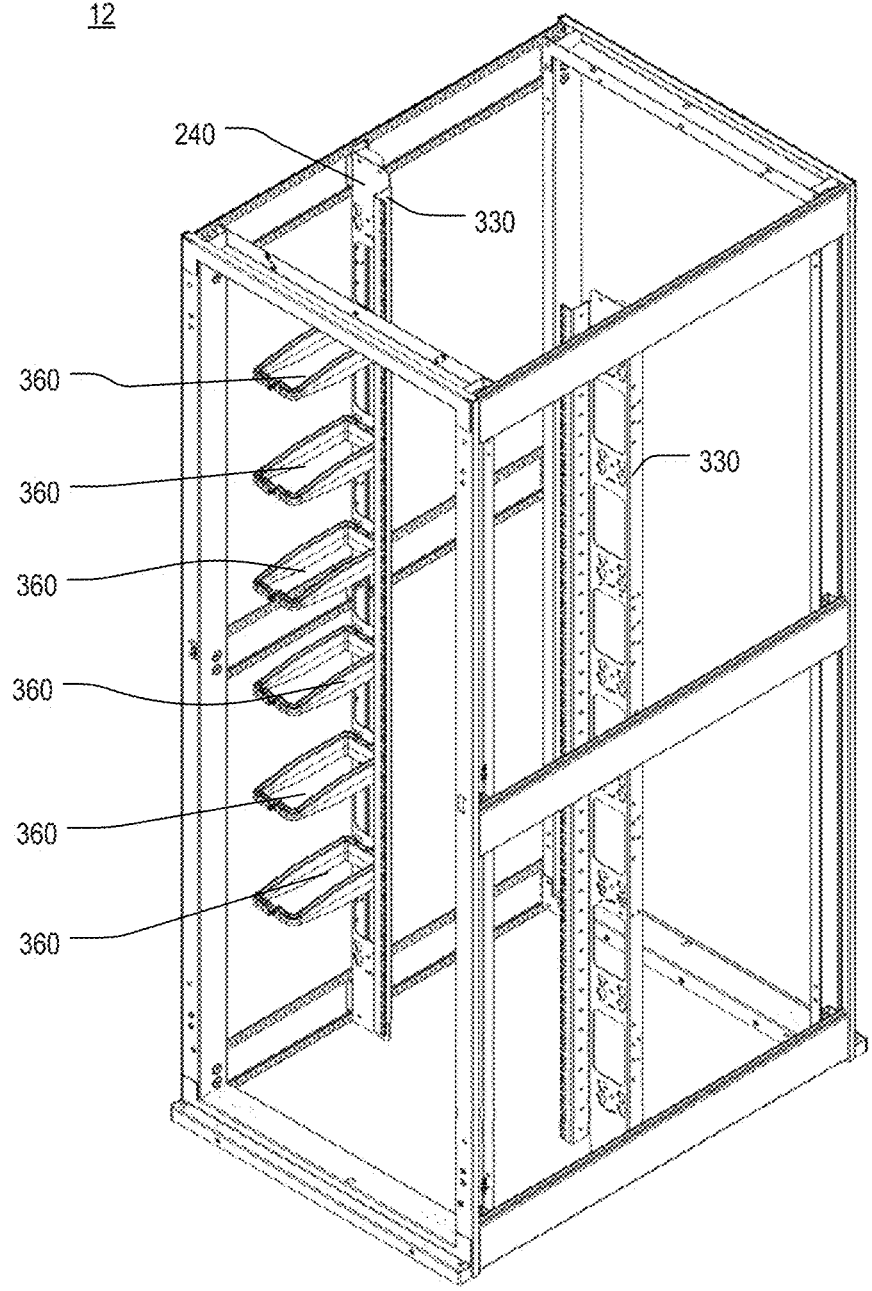
FIG. 8 is an isometric view of a frame structure of similar construction to that of FIG. 1, but of greater depth and width, shown with an alternative type of vertical mounting rail installed thereon.
Figure 9:
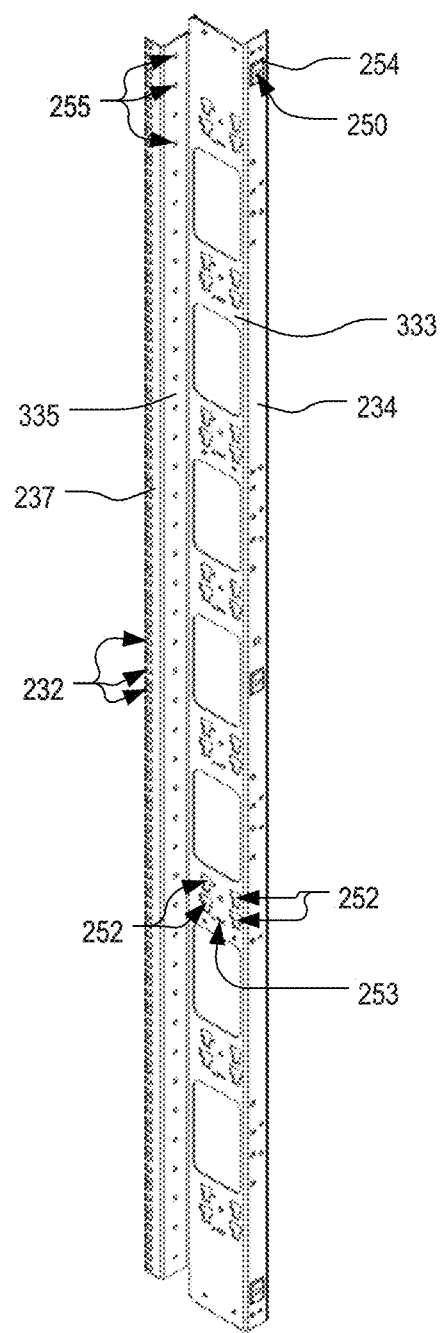
FIG. 9 is an isometric view of one of the vertical mounting rails of FIG. 8.

FIG. 8 is an isometric view of a frame structure 12 of similar construction to that of FIG. 1, but of greater depth and width, shown with an alternative type of vertical mounting rail 330 installed thereon, and FIG. 9 is an isometric view of one of the vertical mounting rails 330 of FIG. 8. As will be apparent, the mounting rail 330 in FIG. 9 is shown in the same orientation as that of the rightmost mounting rail 330 of FIG. 1. Still further, FIG. 10 is an enlarged fragmentary isometric view of the top left corner of the frame structure 12 of FIG. 8.

Figure 10:
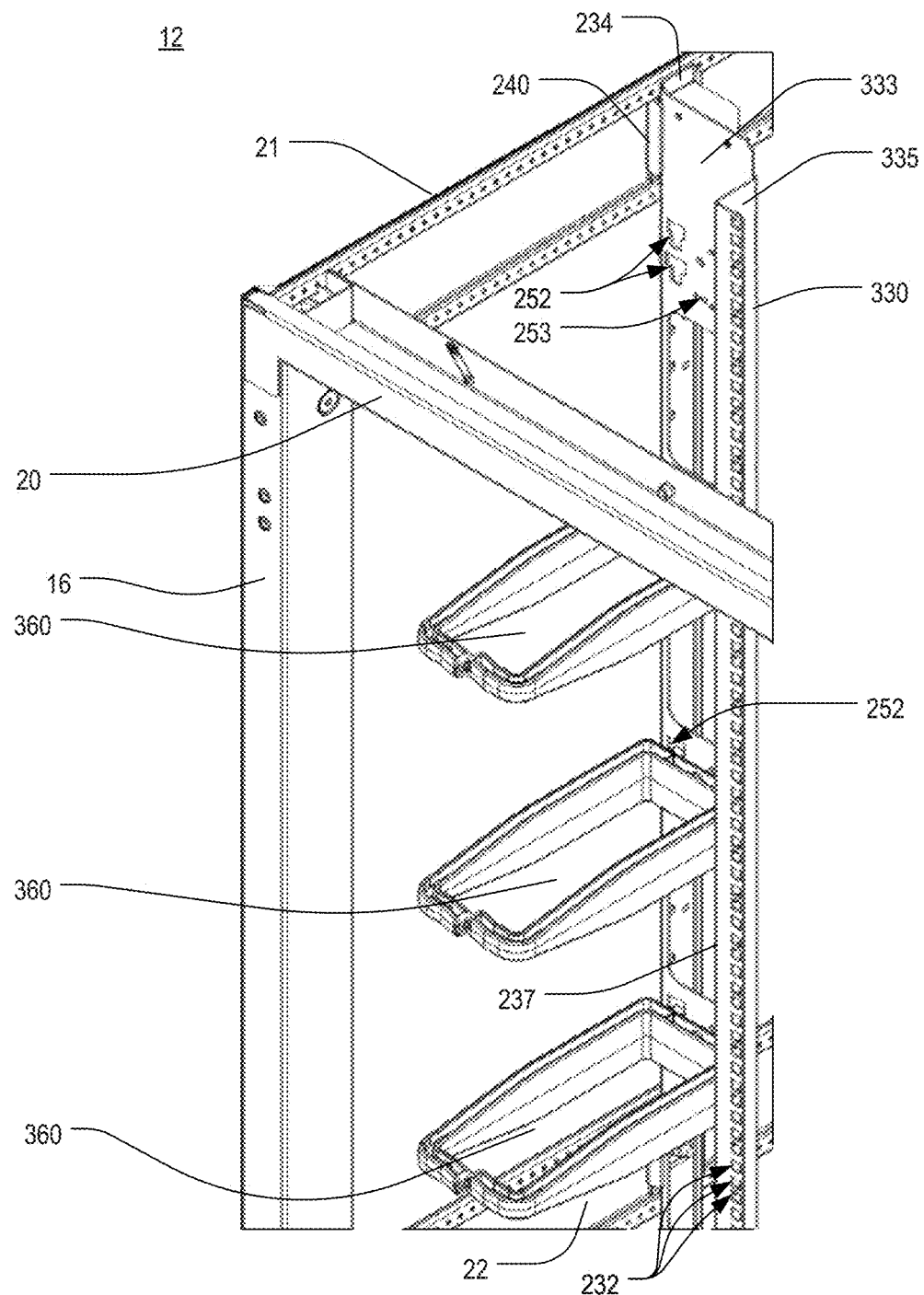
FIG. 10 is an enlarged fragmentary isometric view of the top left corner of the frame structure of FIG. 8.

The alternative mounting rail 330 of FIGS. 8-10 shares many similarities with the mounting rail 230 of FIGS. 1 and 3. The alternative vertical mounting rail 330 is an elongate structure whose cross-section generally includes a C-shaped portion 234, a first support portion 333 extending from one end of the C-shaped portion, a second support portion 335 extending perpendicularly from the first support portion 333, and a third support portion 237 extending perpendicularly from the second support portion 335. The rail 330 may be fastened to the cabinet structure 12 using one or more clamps 240 in similar fashion to that of FIG. 3. A variety of mounting features is disposed along each of the first, second and third support portions 333,335,237; such features may be used for mounting equipment as well as cable management structures. The first support portion 333 includes at least two types of openings 252,253, arranged in sets. In each set are two pairs of keyhole apertures 252 disposed above a single horizontal slot 253, which is centered therebetween. The second support portion 335 includes circular openings 255 are arranged in a column and evenly-spaced along the length of the rail 330. The third support portion 237 includes the standardized equipment mounting holes 232 mentioned previously. In addition to other openings, one or more of the support portions 333,335,237 may be adapted to facilitate routing of cables from one side of the frame structure 12 to the other. Options and features for accommodating cable pass-through at a vertical mounting rail may be disclosed, for example, in co-pending, commonly-assigned non-provisional patent application Ser. No. 13/229, 706, entitled, "RAIL SEAL FOR ELECTRONIC EQUIPMENT ENCLOSURE" (the "'706 application").

Figure 11:
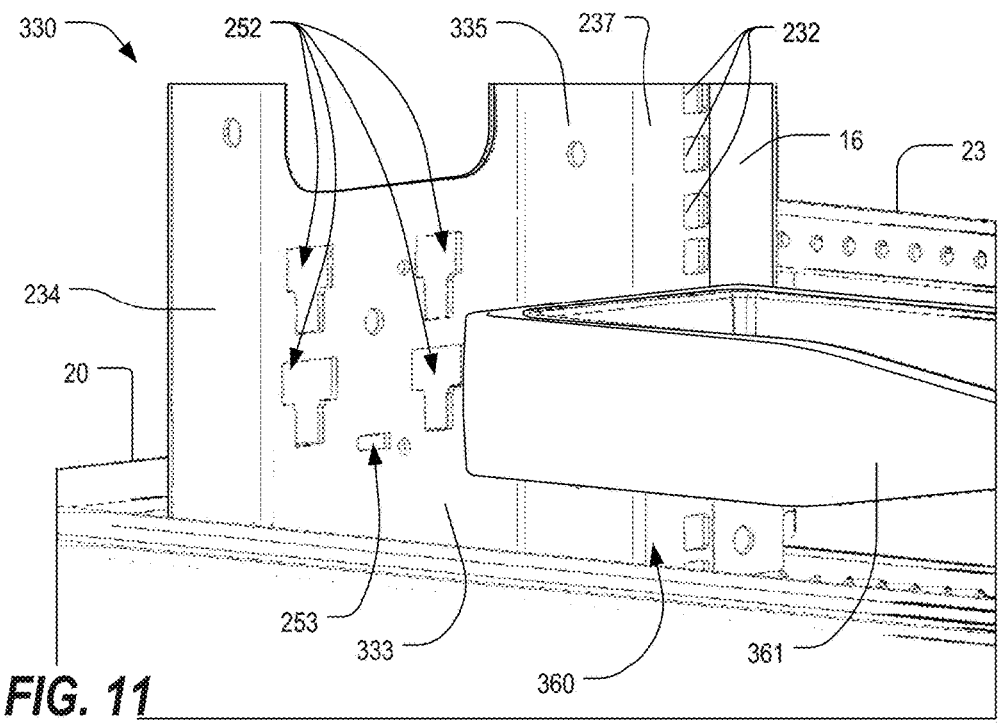
FIGS. 11 and 12 are enlarged fragmentary orthogonal views of the left side and rear of one of the D-rings of FIG. 8 shown detached from the vertical mounting rail.
Figure 12:
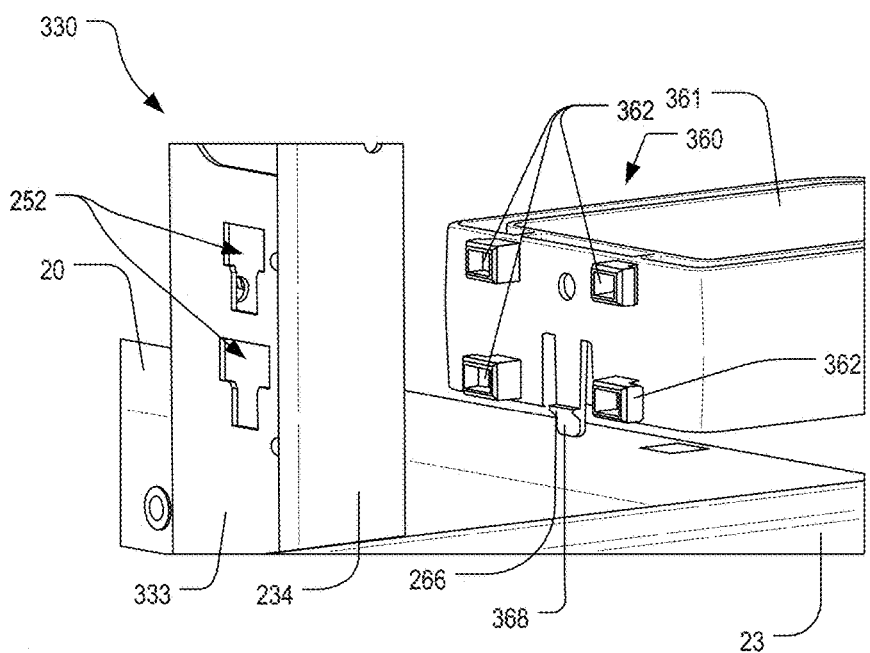

In FIGS. 8 and 10, the cable management structures that are mounted on the vertical mounting rails are D-rings 360, although a wide variety of different cable management structures may be mounted to the vertical mounting rails, as will be explained in further detail below. FIGS. 11 and 12 are enlarged fragmentary orthogonal view of the left side and rear of one of the D-rings 360 of FIG. 8 shown detached from the vertical mounting rail 330. Each D-ring 360 includes a ring portion 361 and a support portion. The ring portion 361 may be generally similar in construction to the ring portion of the D-rings of FIGS. 5-7 and variations thereof. The support portion includes five elements: four keyhole bosses 362 extending laterally from the back of the ring portion 361, and an alignment boss 266 protruding from the end of a tab 368 extending downward from a central area of the back of the ring portion 361. The support portion of the D-ring 360 is adapted to be connected to, and supported by, one set of openings 252,253 in the vertical mounting rail 330 without interfering with the use of the equipment mounting holes 232. In particular, the four keyhole bosses 362 are arranged to interact with the keyhole apertures 252, of the selected set of openings 252,253, in the first support portion 333, and the alignment boss 266 is arranged to interact with the horizontal slot 253 of the same set of openings 252,253. This interaction may perhaps be best discerned from FIGS. 10-12 but is somewhat similar to that of the D-rings 260 shown in FIGS. 6 and 7.

Notably, the D-rings 260,360 described and illustrated herein may be connected to, or mounted on, the vertical mounting rails 230,330 without the use of tools. In particular, the D-rings 260,360 may be mounted by inserting the keyhole bosses 262,362 into the upper (wider) portion of respective keyhole apertures 252 and lowering them until they are seated in the lower (narrower) portion thereof, at which point the alignment boss 266 snaps into place in the horizontal slot 253. In at least some embodiments, keyhole apertures 252 may be of varying sizes. For example, in at least some embodiments, an upper keyhole aperture may be smaller than a lower keyhole aperture.

Figure 14:
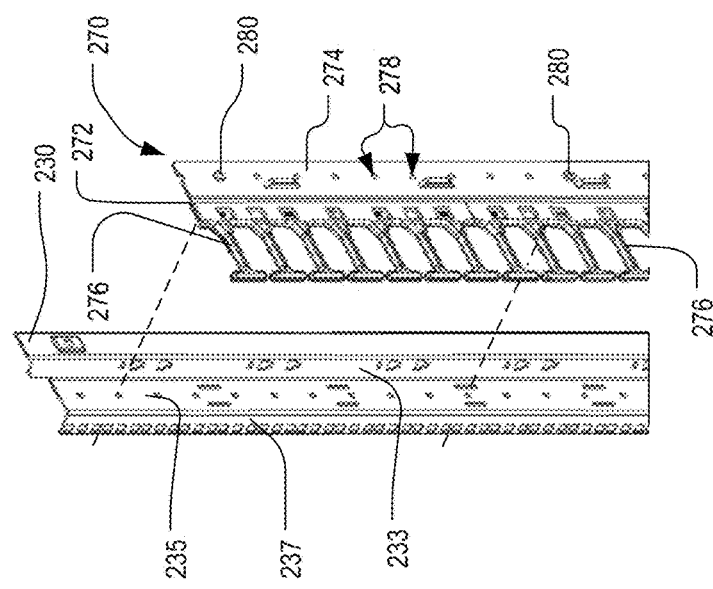
FIG. 14 is an exploded fragmentary isometric view of the vertical mounting rail and cable guides of FIG. 13.
Figure 13:
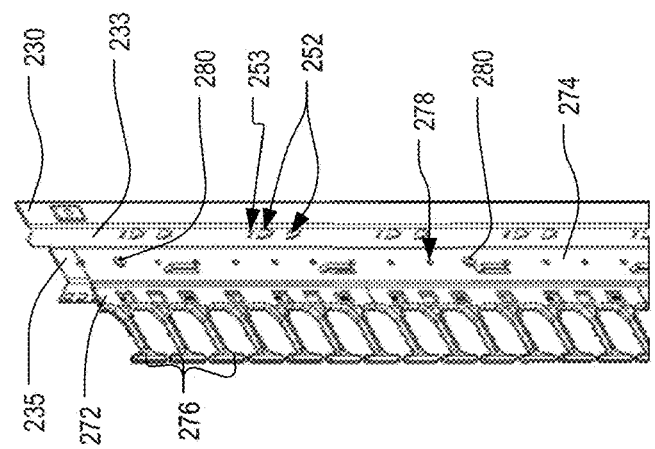
FIG. 13 is a fragmentary isometric view of a top portion of the vertical mounting rail of FIG. 3, shown with a plurality of cable management structures in the form of multi-fingered cable guides mounted thereon.

FIG. 13 is a fragmentary isometric view of a top portion of the vertical mounting rail 230 of FIG. 3, shown with a plurality of cable management structures in the form of multi-fingered cable guides 270 mounted thereon, and FIG. 14 is an exploded fragmentary isometric view of the vertical mounting rail 230 and cable guides 270 of FIG. 13. As shown therein, each cable guide includes a cable ring portion 272, which includes a plurality of T-shaped fingers 276 forming cable rings therebetween, and a base portion 274, which is generally planar and includes a plurality of circular openings 278 arranged in a column and distributed along the length thereof at a spacing that corresponds to that of the openings 255 in the second support portion 235 of the mounting rail 230. In this regard, cable management structures suitable for use as the cable ring portions 272 of the present invention are shown and described in commonly-assigned U.S. Pat. No. 7,119,282, entitled "VERTICAL CABLE MANAGEMENT RACK," the entirety of which is incorporated herein by reference. Like the structures described therein, the T-shaped fingers 276 are preferably arranged at 1 RMU spacings. The multi-fingered cable guides 270 may be attached to, and flush against, the second support portion 235 of the mounting rail 230 using fasteners 280. In this arrangement, unrestricted access to the sets of openings 252,253 in the first support portion 233 continues to be available, thereby permitting D-rings 260 or other cable management structures to be mounted thereto if desired. Furthermore, the cable rings formed by the T-shaped fingers 276 are conveniently located alongside equipment mounted to the equipment mounting rails (third support portions) 233. Still further, because the T-shaped fingers 276 and the cable rings formed thereby are arranged at 1 RMU spacings, the cable rings are aligned with conventional, standardized rack mounting locations defined by the equipment mounting holes 232.

Figure 15:
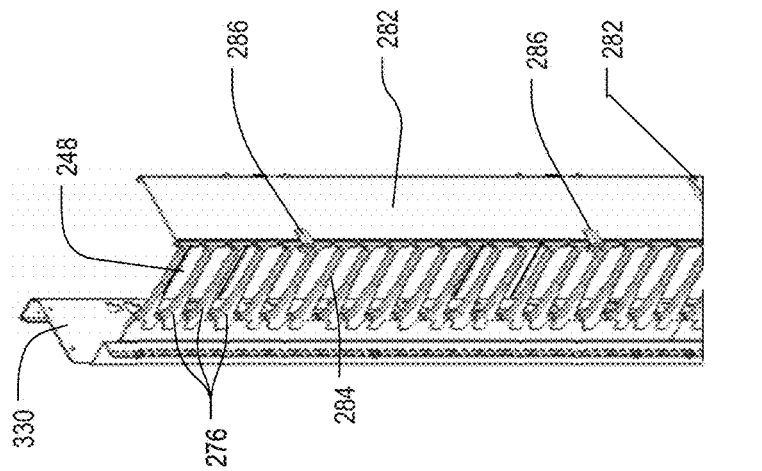
FIG. 15 is a fragmentary isometric view of a top portion of the vertical mounting rail of FIG. 9, taken from the left side, shown with a plurality of cable management structures in the form of multi-fingered cable guides, doors and door supports mounted thereon.
Figure 16A:
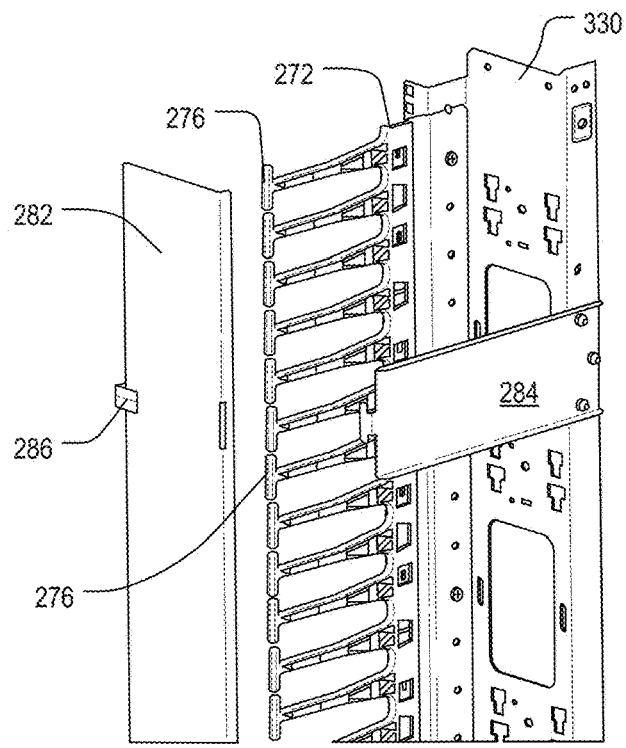
FIG. 16A is a partially exploded fragmentary isometric view, taken from the right side, of the arrangement of FIG. 15.
Figure 16B:
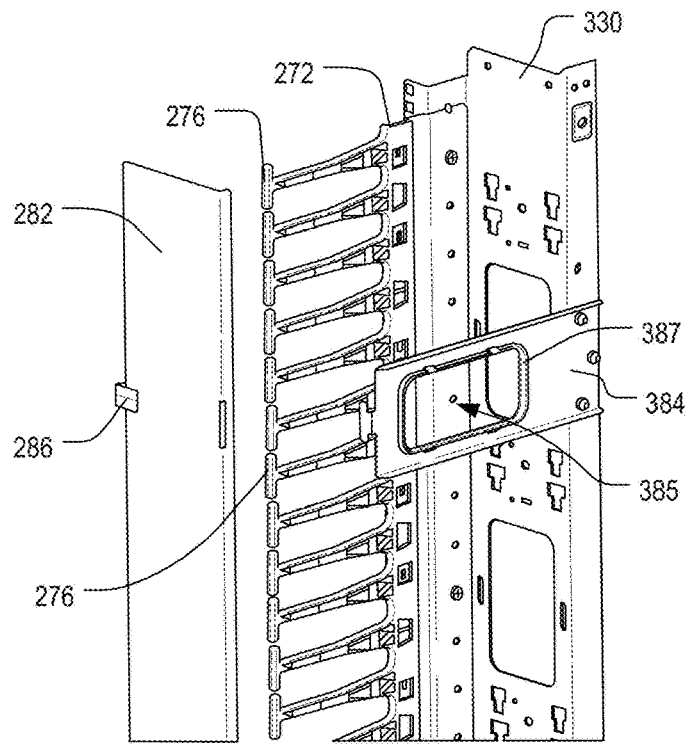
FIG. 16B is a partially exploded fragmentary isometric view, taken from the right side, of an alternative embodiment of the arrangement of FIG. 16A.

FIG. 15 is a fragmentary isometric view of a top portion of the vertical mounting rail 330 of FIG. 9, taken from the left side, shown with a plurality of cable management structures in the form of multi-fingered cable guides 270, doors 282 and door supports 284 mounted thereon, and FIG. 16A is a partially exploded fragmentary isometric view, taken from the right side, of the arrangement of FIG. 15. The cable guides 270 are similar to those of FIGS. 13 and 14 and are installed in like manner to the second support portions 335 of a mounting rail 330. The doors 282 may be supported along one side with hinges 286 supported between adjacent ends of the T-shaped fingers 276 and on the other side by the door supports 284. As shown in FIG. 16A, each door support 284 is itself supported by the C-shaped portion 234 using fasteners 280. FIG. 16B is a partially exploded fragmentary isometric view, taken from the right side, of an alternative embodiment of the arrangement of FIG. 16A. As shown in FIG. 16B, a door support 384 may itself include an aperture 385 to permit cables to pass therethrough. Edges 387 of the aperture 385 can be rounded so as to prevent unnecessary friction against cables positioned to pass through the aperture 385. Further details regarding the arrangement of FIGS. 15, 16A and 16B can be found in the '706 application.

In certain contemplated embodiments (not illustrated), cable management structures may be separately anchored to the vertical mounting rail 230,330 or frame structure 12 after being fastened to the vertical mounting rail 230,330. Such anchoring may be facilitated with a separate fastener. In at least some other embodiments, such anchoring is not required for structural stability.

Figure 17:
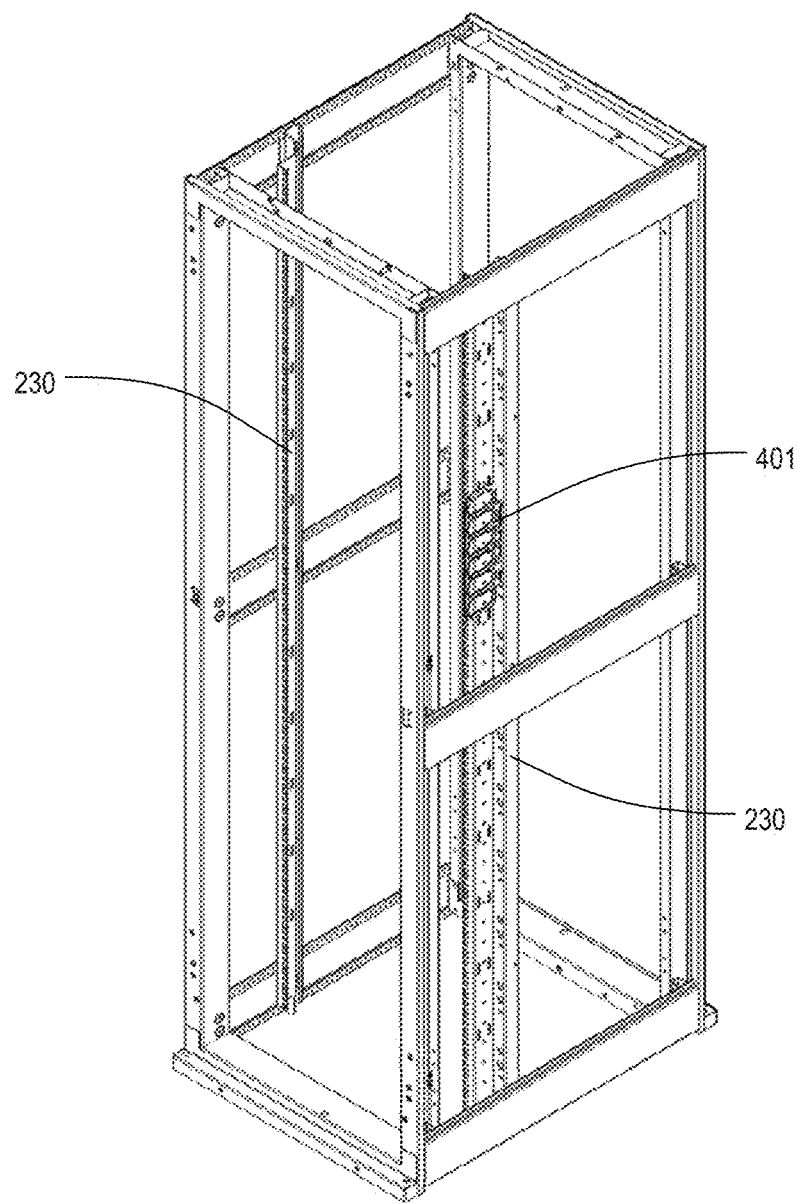
FIG. 17 is an isometric view of the frame structure of FIG. 1, shown with a T-channel cable manager array mounted on one of the vertical mounting rails.
Figure 18:
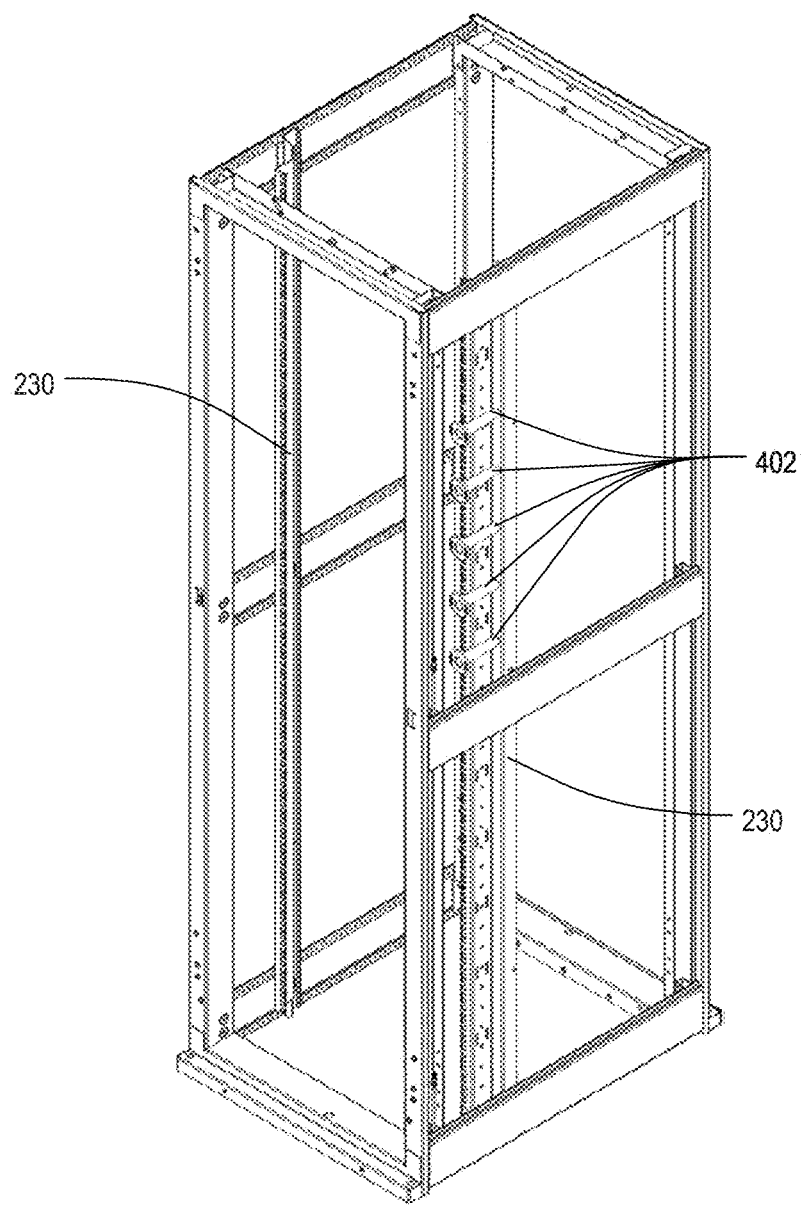
FIG. 18 is an isometric view of the frame structure of FIG. 1, shown with a plurality of cable manager spools mounted on one of the vertical mounting rails.
Figure 19:
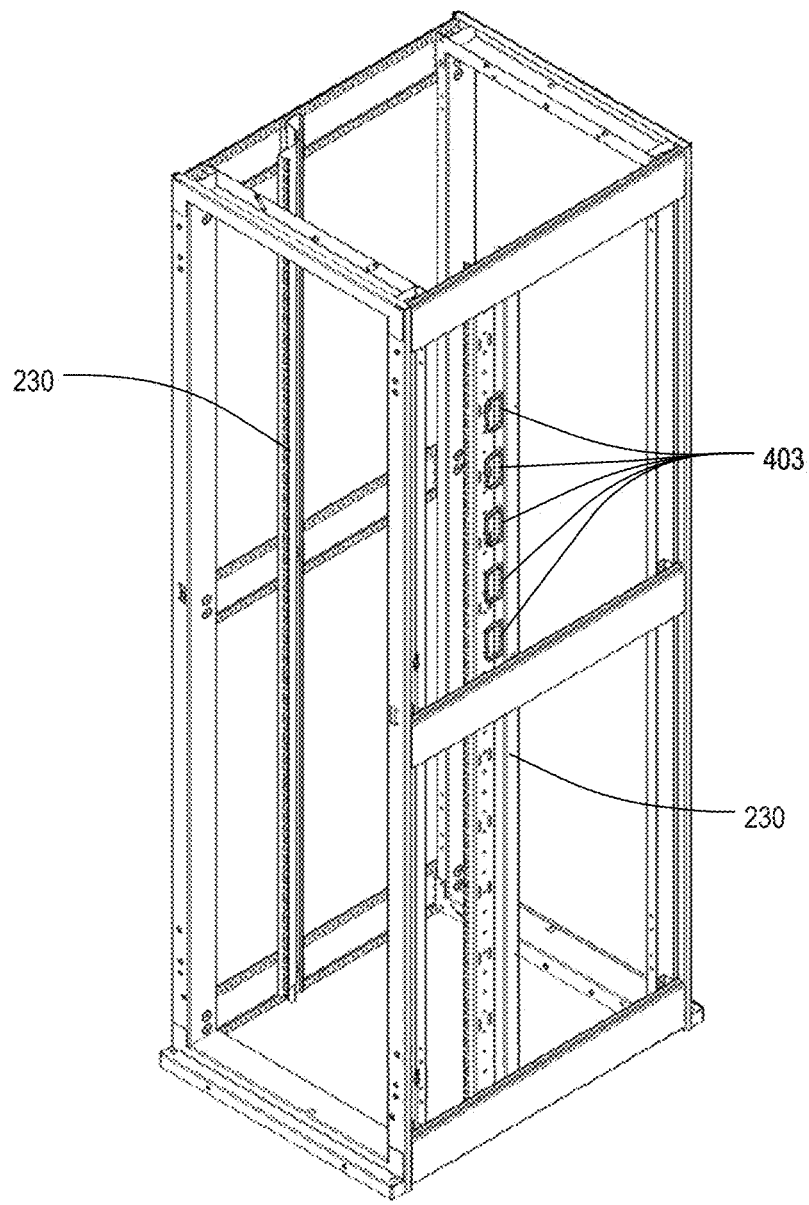
FIG. 19 is an isometric view of the frame structure of FIG. 1, shown with a plurality of vertical C-channel cable managers mounted on one of the vertical mounting rails.
Figure 20:
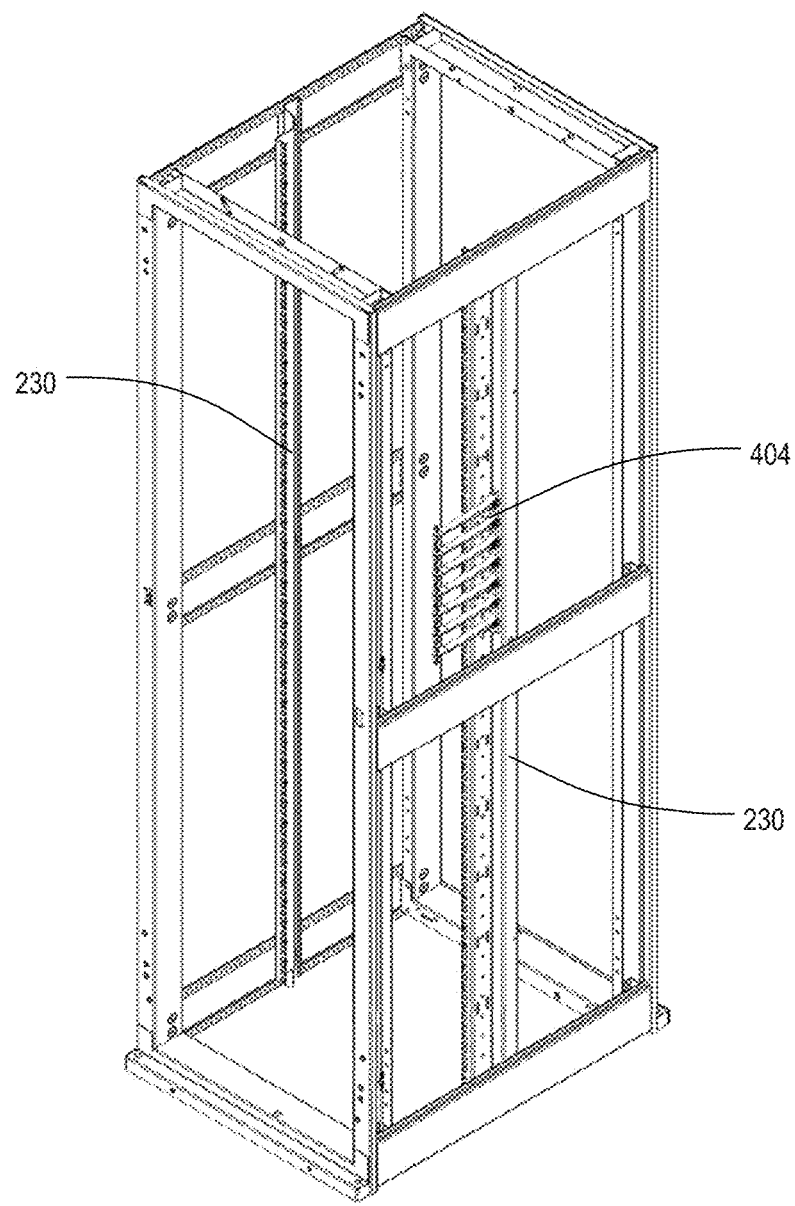
FIG. 20 is an isometric view of the frame structure of FIG. 1, shown with a multi-finger cable manager array mounted on one of the vertical mounting rails.

FIGS. 17-20 illustrate the frame structure 12 of FIG. 1 with various other cable management structures mounted to the vertical mounting rails 230. FIG. 17 is an isometric view of the frame structure 12 of FIG. 1, shown with a T-channel cable manager array 401 mounted on one of the vertical mounting rails 230. FIG. 18 is an isometric view of the frame structure 12 of FIG. 1, shown with a plurality of cable manager spools 402 mounted on one of the vertical mounting rails 230. FIG. 19 is an isometric view of the frame structure 12 of FIG. 1, shown with a plurality of vertical C-channel cable managers 403 mounted on one of the vertical mounting rails 230. FIG. 20 is an isometric view of the frame structure 12 of FIG. 1, shown with a multi-finger cable manager array 404 mounted on one of the vertical mounting rails 230.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure comprising:
a frame structure including:
a pair of front vertical support posts connected together by a plurality of horizontal front cross members to define a front frame, the plurality of horizontal front cross members at least including an upper horizontal front cross member and a lower horizontal front cross member,
a pair of rear vertical support posts connected together by a plurality of horizontal rear cross members to define a rear frame, the plurality of horizontal rear cross members at least including an upper horizontal rear cross member, distinct from the upper horizontal front cross member, and a lower horizontal rear cross member, and
a plurality of distinct horizontal side cross members, each of which connects to each of the front frame and the rear frame, the plurality of horizontal side cross members at least including vertically spaced-apart upper and lower horizontal side cross members each defining an interior-facing channel;
one or more panels mounted on the frame structure, the frame structure and the one or more panels together defining an enclosed space for electronic equipment;
at least one separate mounting rail, oriented vertically and mounted within the enclosed space to each of the upper and lower horizontal side cross members of the frame structure, the at least one separate mounting rail having a generally uniform cross-sectional shape and including:
a fastening portion extending an entire length of the at least one separate mounting rail in the vertical direction, the fastening portion being arranged to interface with the interior-facing channel of each of the upper and lower horizontal side cross members of the frame structure,
a first support portion extending from the fastening portion and including at least one keyhole-shaped opening disposed adjacent to a slotted opening,
a second support portion extending from the first support portion and including a plurality of generally circular openings, and
a third support portion extending from the second support portion and including a column of generally evenly-spaced equipment mounting holes;
a first cable management accessory including a keyhole boss and an alignment tab, wherein the keyhole boss is received, via snap-fit, within the at least one keyhole-shaped opening and the alignment tab is received within the slotted opening, thereby securing the first cable management accessory to the first support portion of the at least one separate mounting rail without a separate fastener; and
a multi-fingered cable guide having a flat base portion and a plurality of T-shaped fingers that extend forwardly from, and generally within a plane defined by, the flat base portion, wherein the base portion of the multi-fingered cable guide is arranged flush against the second portion of the at least one separate mounting rail such that the base portion substantially overlaps with and is secured against the second portion, whereby the first cable management accessory extends into a cable management space adjacent to the plurality of T-shaped fingers.

2. The electronic equipment enclosure of claim 1, further comprising a second cable management accessory secured, without a separate fastener, to one of the first, second and third support portions.

3. The electronic equipment enclosure of claim 2, wherein the second cable management accessory is of a different type than the first cable management accessory.

4. The electronic equipment enclosure of claim 1, wherein the first cable management accessory is a cable manager spool.

5. The electronic equipment enclosure of claim 1, wherein the one or more panels includes a top panel having one or more panel knockouts arranged therein and configured to be removable therefrom to provide a pass-through opening for a cable.

6. The electronic equipment enclosure of claim 1, wherein the first support portion is oriented generally perpendicular to the fastening portion.

7. The electronic equipment enclosure of claim 1, wherein the second support portion is oriented generally perpendicular to the first support portion.

8. The electronic equipment enclosure of claim 1, wherein the third support portion is oriented generally perpendicular to the second support portion.

9. The electronic equipment enclosure of claim 1, wherein the second support portion further includes a plurality of vertically-oriented slotted openings.

10. The electronic equipment enclosure of claim 1, further comprising a door secured to a distal end of one or more of the plurality of T-shaped fingers.

11. An electronic equipment enclosure comprising:
a frame structure comprised of:
a pair of front vertical support posts connected together by a plurality of horizontal front cross members to define a front frame, the plurality of horizontal front cross members at least including an upper horizontal front cross member and a lower horizontal front cross member,
a pair of rear vertical support posts connected together by a plurality of horizontal rear cross members to define a rear frame, the plurality of horizontal rear cross members at least including an upper horizontal rear cross member, distinct from the upper horizontal front cross member, and a lower horizontal rear cross member, and
a plurality of distinct horizontal side cross members, each of which connects to each of the front frame and the rear frame, the plurality of horizontal side cross members at least including vertically spaced-apart upper and lower horizontal side cross members each defining an interior-facing channel;
at least one separate mounting rail, oriented vertically and mounted to each of the upper and lower horizontal side cross members of the frame structure, the at least one separate mounting rail having a generally uniform cross-sectional shape and including:
a fastening portion extending an entire length of the at least one separate mounting rail in the vertical direction, the fastening portion being arranged to interface with the interior-facing channel of each of the upper and lower horizontal side cross members of the frame structure,
a first support portion extending from and oriented generally perpendicular to the fastening portion,
a second support portion extending from and oriented generally perpendicular to the first support portion, and
a third support portion extending from and oriented generally perpendicular to the second support portion,
wherein each of the first, second and third support portions includes one or more openings, and
wherein the second support portion is oriented to be generally parallel to the fastening portion and the third support portion is oriented to be generally parallel to the first support portion; and
a first cable management accessory having a boss received, via snap-fit, within one of the one or more openings of the first, second or third support portions, thereby securing the first cable management accessory to the at least one separate mounting rail without a separate fastener.

12. The electronic equipment enclosure of claim 11, wherein the first cable management accessory is a D-ring cable guide.

13. The electronic equipment enclosure of claim 11, wherein the first cable management accessory is a T-channel cable manager array.

14. The electronic equipment enclosure of claim 11, wherein the first cable management accessory is a cable manager spool.

15. The electronic equipment enclosure of claim 11, wherein the first cable management accessory is a vertical C-channel cable manager.

16. An electronic equipment enclosure comprising:
a frame structure including:
a pair of front vertical support posts connected together by a plurality of horizontal front cross members to define a front frame, the plurality of horizontal front cross members at least including an upper horizontal front cross member and a lower horizontal front cross member,
a pair of rear vertical support posts connected together by a plurality of horizontal rear cross members to define a rear frame, the plurality of horizontal rear cross members at least including an upper horizontal rear cross member, distinct from the upper horizontal front cross member, and a lower horizontal rear cross member, and
a plurality of distinct horizontal side cross members, each of which connects to each of the front frame and the rear frame, the plurality of horizontal side cross members at least including vertically spaced-apart upper and lower horizontal side cross members each defining an interior-facing channel;
one or more panels mounted on the frame structure, the frame structure and the one or more panels together defining an enclosed space for electronic equipment;
at least one separate mounting rail, oriented vertically and mounted within the enclosed space to each of the upper and lower horizontal side cross members of the frame structure, the at least one separate mounting rail having a generally uniform cross-sectional shape and including:
a fastening portion extending an entire length of the at least one separate mounting rail in the vertical direction, the fastening portion being arranged to interface with the interior-facing channel of each of the upper and lower horizontal side cross members of the frame structure,
a first support portion extending perpendicularly from the fastening portion and including a first pair of keyhole-shaped openings, each having a first size, and a second pair of keyhole-shaped openings arranged beneath the first pair of keyhole-shaped openings and each having a second size that is different from the first size, a second support portion extending perpendicularly from the first support portion and including a plurality of generally circular openings, and a third support portion extending perpendicularly from the second support portion and including a column of generally evenly-spaced equipment mounting holes, wherein the second support portion is oriented to be generally parallel to the fastening portion and the third support portion is oriented to be generally parallel to the first support portion; and a first cable management accessory, a support portion of which includes a first pair of keyhole bosses, each of which is sized to fit within a respective one of the first pair of keyhole-shaped openings, and a second pair of keyhole bosses, each of which is sized to fit within a respective one of the second pair of keyhole-shaped openings, such that, when the keyhole bosses are received via snap-fit within the corresponding keyhole-shaped openings, the first cable management accessory is secured to the first support portion of the at least one separate mounting rail without a separate fastener.

17. The electronic equipment enclosure of claim 16, wherein the first cable management accessory is a D-ring cable guide.

18. The electronic equipment enclosure of claim 16, wherein the first cable management accessory is a cable manager spool.

19. The electronic equipment enclosure of claim 16, wherein the one or more panels includes a top panel having one or more panel knockouts arranged therein and configured to be removable therefrom to provide a pass-through opening for a cable.

20. The electronic equipment enclosure of claim 16, wherein the second size is larger than the first size.

\* \* \* \* \*